US012805391B2

(12) United States Patent
Kim et al.

(10) Patent No.: US 12,805,391 B2
(45) Date of Patent: Nov. 17, 2026

(54) DISPLAY DEVICE

(71) Applicant: LG ELECTRONICS INC., Seoul (KR)

(72) Inventors: Myoungsoo Kim, Seoul (KR); Jinsung Kim, Seoul (KR); Wonjae Chang, Seoul (KR); Byungjun Kang, Seoul (KR); Junghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 406 days.

(21) Appl. No.: 18/030,394

(22) PCT Filed: Oct. 13, 2020

(86) PCT No.: PCT/KR2020/013932

§ 371 (c)(1),
(2) Date: Apr. 5, 2023

(87) PCT Pub. No.: WO2022/080514

PCT Pub. Date: Apr. 21, 2022

(65) Prior Publication Data

US 2023/0378141 A1 Nov. 23, 2023

(51) Int. Cl.
*H10W 90/00* (2026.01)
*H10H 20/857* (2025.01)

(52) U.S. Cl.
CPC .......... *H10W 90/00* (2026.01); *H10H 20/857* (2025.01)

(58) Field of Classification Search
CPC .......................... H01L 25/0753; H10H 20/857
See application file for complete search history.

(56) References Cited

U.S. PATENT DOCUMENTS 11,296,254 B2 * 4/2022 Lin ...................... H01L 25/0753
11,342,376 B2 * 5/2022 Zhang .................. H10H 20/857
11,605,757 B2 * 3/2023 Park ........................ H05B 33/10
12,278,221 B2 * 4/2025 Kwon ..................... H10H 20/01
2017/0077348 A1 * 3/2017 Lim ........................ H10H 20/84
2017/0104009 A1 4/2017 Peng et al.
2017/0358563 A1 * 12/2017 Cho ...................... H10H 20/819
2019/0325790 A1 * 10/2019 Park ........................ H10H 20/84
2019/0326144 A1 * 10/2019 Shim ....................... B65G 47/92
2019/0326477 A1 * 10/2019 Kim ..................... H01L 25/0753
2020/0203321 A1 * 6/2020 Choi ................... H01L 25/0753
2020/0273906 A1 * 8/2020 Li ......................... H10H 20/831
(Continued)

FOREIGN PATENT DOCUMENTS

CN 110350063 A * 10/2019 ......... H01L 21/6835
CN 110634906 A * 12/2019 ........... H10H 20/857
(Continued)

*Primary Examiner* — Jeff W Natalini
*Assistant Examiner* — Andrew John Zabel
(74) *Attorney, Agent, or Firm* — Birch, Stewart, Kolasch & Birch, LLP

(57) ABSTRACT

A display device comprises a substrate comprises a substrate comprising a plurality of sub pixels, a first electrode in the plurality of sub pixels, a second electrode in the plurality of sub pixels, and adjacent to the first electrode, a first magnetic layer between the first electrode and the second electrode, and a plurality of light emitting elements between the first electrode and the second electrode. The light emitting element comprises at least one second magnetic layer in contact with the magnetic layer.

20 Claims, 11 Drawing Sheets

(56) References Cited

U.S. PATENT DOCUMENTS

| | | | |
|---|---|---|---|
| 2022/0302351 | A1 | 9/2022 | Cho et al. |
| 2022/0352445 | A1 | 11/2022 | Kim et al. |

FOREIGN PATENT DOCUMENTS

| | | | |
|---|---|---|---|
| CN | 110739375 | A | 1/2020 |
| KR | 10-2016-0006339 | A | 1/2016 |
| KR | 10-2017-0024905 | A | 3/2017 |
| KR | 10-2017-0141305 | A | 12/2017 |
| KR | 10-1987196 | B1 | 6/2019 |
| KR | 10-2019-0088321 | A | 7/2019 |
| KR | 10-2020-0023316 | A | 3/2020 |
| KR | 10-2020-0026682 | A | 3/2020 |
| KR | 10-2020-0026693 | A | 3/2020 |
| KR | 10-2020-0026760 | A | 3/2020 |

* cited by examiner

DISPLAY DEVICE

CROSS REFERENCE TO RELATED APPLICATION

This application is the National Phase of PCT International Application No. PCT/KR2020/013932, filed on Oct. 13, 2020, which is hereby expressly incorporated by reference into the present application.

TECHNICAL FIELD

The embodiment relates to a display device.

BACKGROUND ART

A display device displays a high-quality image by using a self-light emitting element such as a light emitting diode as a light source of a pixel. The light emitting diode has excellent durability, long lifespan, and high luminance even under harsh environmental conditions, and are in the limelight as a light source for next-generation display devices.

Recently, a super small-sized light emitting diode is manufactured using a material having a highly reliable inorganic crystal structure, and the super small-sized light emitting diode is disposed on a panel of a display device (hereinafter referred to as a "display panel") such that a light source is manufactured and research is being conducted to use it as a next-generation light source for pixel.

In order to implement high resolution, a size of pixel is gradually getting smaller, and a number of light emitting elements are arranged in the pixel of such a reduced size. Accordingly, research on the manufacture of super small-sized light emitting diode as small as micro or nano scale is being actively conducted.

Generally, a display panel includes millions of pixels. It is very difficult to align light emitting elements to each of millions of small-sized pixels. Accordingly, various studies on a method of aligning light emitting elements on a display panel have recently been actively conducted.

One of the alignment technologies that has recently been spotlighted is an alignment technology using dielectrophoretic force formed between electrodes. That is, an electric field is formed between the two electrodes by voltage applied to the two electrodes. When the light emitting element is positioned around the two electrodes, holes and electrons of the light emitting element move according to the electric field formed between the two electrodes to align the light emitting element between the two electrodes.

As shown in FIG. 1A, an electric field E is formed in a vertical direction between the first electrode 1*a* and the second electrode 1*b*. When the longitudinal direction of the light emitting element 3 is positioned within a predetermined angle θ with respect to the direction in which the electric field E is formed (hereinafter referred to as "vertical direction"), the light emitting element is aligned in the vertical direction. The predetermined angle θ is the limit range of the electric field E that can align the light emitting element.

However, as shown in FIG. 1B, when the longitudinal direction of the light emitting element 3 is positioned beyond a predetermined angle θ with respect to the vertical direction, the effect of the electric field E on the light emitting element 3 is limited. As a result, the light emitting element 3 is not aligned in the vertical direction.

On the other hand, in FIG. 1B, the polarity of the light emitting element 4 is positioned opposite to the vertical direction. That is, the P-type side of the light-emitting element 4 is positioned toward the first electrode 1*a* to which a negative voltage is supplied, and the N-type side of the light-emitting element 4 is positioned toward the second electrode 1*b* to which a positive voltage is supplied. In this case, the light emitting element 4 is not aligned along the vertical direction because it is not affected by the electric field E.

For this reason, in the related art, light emitting elements that are not aligned with each pixel of a display panel have the following problems.

First, light emitting elements that are not aligned with each pixel of the display panel are impossible to emit light because they are not electrically connected to electrodes. Accordingly, since the light emitting elements cannot be used as a light source, these resulted in wasted costs.

Second, the light emitting elements that are not aligned with each pixel of the display panel hinder progress of light emitted by the aligned light emitting elements, that is, normal light emitting elements. Accordingly, there is a problem in that the luminance of the display panel is lowered.

DISCLOSURE

Technical Problem

An object of the embodiment is to solve the foregoing and other problems.

Another object of the embodiment is to provide a display device capable of improving the degree of alignment of light emitting elements.

Another object of the embodiments is to provide a display device capable of reducing cost.

Another object of the embodiments is to provide a display device capable of securing high luminance.

Technical Solution

According to one aspect of the embodiment to achieve the above or other object, a display device, comprising: a substrate comprising a plurality of sub pixels;

a first electrode in the plurality of sub pixels; a second electrode in the plurality of sub pixels, and adjacent to the first electrode; a first magnetic layer between the first electrode and the second electrode; and a plurality of light emitting elements between the first electrode and the second electrode, wherein the light emitting element comprises at least one second magnetic layer in contact with the magnetic layer.

Advantageous Effects

Effects of the wireless power transmission apparatus according to the embodiments are described as follows.

According to at least one of the embodiments, light emitting elements are primarily aligned by dielectrophoretic force by the voltage applied between the first electrode and the second electrode, and light emitting elements that is not aligned in the primary alignment by using the magnetic force of the magnetic layer are secondary aligned. Elements can be second-ordered. Accordingly, it is possible to secure high luminance by improving the degree of alignment of the light emitting elements dropped on each sub-pixel.

According to at least one of the embodiments, the lower surface of the magnetic layer may be in contact with the bottom surface of the seating portion, thereby maximizing the contact area between the magnetic layer and the first electrode. Accordingly, contact resistance between the magnetic layer and the first electrode can be minimized so that the voltage of the first electrode can be easily applied to the light emitting element through the magnetic layer.

According to at least one of the embodiments, the blocking layer as well as the magnetic layer of the light emitting elements is formed of metal and is in contact with the magnetic layer such that the voltage of the first electrode can be applied to the blocking layer as well as the magnetic layer via the magnetic layer. Accordingly, current flows more smoothly to the light emitting element, and high output light can be obtained by driving at a low voltage.

According to at least one of the embodiments, since the magnetic layer surrounds the first electrode, it is possible to prevent the first electrode from being separated from the substrate.

According to at least one of the embodiments, a contact area between the magnetic layer and the first electrode can be maximized by contacting the magnetic layer with the side surface as well as the upper surface of the first electrode. Accordingly, by minimizing contact resistance between the magnetic layer and the first electrode, the voltage of the first electrode can be easily applied to the light emitting element through the magnetic layer.

According to at least one of the embodiments, by disposing the blocking layer on the first electrode, the magnetic layer of the misaligned light emitting element may prevent the magnetic layer from being attached. Accordingly, it is easy to collect the misaligned light emitting elements, and the manufacturing cost can be drastically reduced according to the increase in the collection rate.

A further scope of applicability of the embodiments will become apparent from the detailed description that follows. However, since various changes and modifications within the spirit and scope of the embodiments can be clearly understood by those skilled in the art, it should be understood that the detailed description and specific embodiments, such as preferred embodiments, are given by way of example only.

MODE FOR INVENTION

Hereinafter, preferred embodiments of the present disclosure will be described in detail with reference to the accompanying drawings. However, the technical idea of the present disclosure is not limited to some of the described embodiments, but may be implemented in a variety of different forms, and if it is within the scope of the technical idea of the present disclosure, one or more of the components among the embodiments can be used by selectively combining and substituting. In addition, terms (including technical and scientific terms) used in the embodiments of the present disclosure may be interpreted in a meaning that can be generally understood by those of ordinary skill in the art to which the present disclosure belongs, unless explicitly specifically defined and described, and commonly used terms, such as terms defined in a dictionary, can be interpreted in consideration of contextual meanings of related technologies. Also, terms used in the embodiments of the present disclosure are for describing the embodiments and are not intended to limit the present disclosure. In this specification, the singular form may also include the plural form unless otherwise specified in the phrase, and when described as "at least one (or one or more) of B and C", it can include one or more of any combination that may be combined with A, B, and C. In addition, terms such as first, second, A, B, (a), and (b) may be used to describe components of an embodiment of the present disclosure. These terms are only used to distinguish the component from other components, and the term is not limited to the nature, order, or sequence of the corresponding component. In addition, when a component is described as being 'connected', 'coupled' or 'joined' to the other component, it may include a case where the component is not only directly 'connected', 'combined', or 'joined' to the other component, but also a case where a component is 'connected', 'combined', or 'joined' to the other component through another component. In addition, when it is described as being formed or disposed on the "top (upper) or bottom (lower)" of each component, it may include a case where two components are not only in direct contact with each other, but also a case where another component is formed or disposed between two components. In addition, when expressed as "up (up) or down (down)", it may include the meaning of not only the upward direction but also the downward direction based on one component.

Figure 1A:
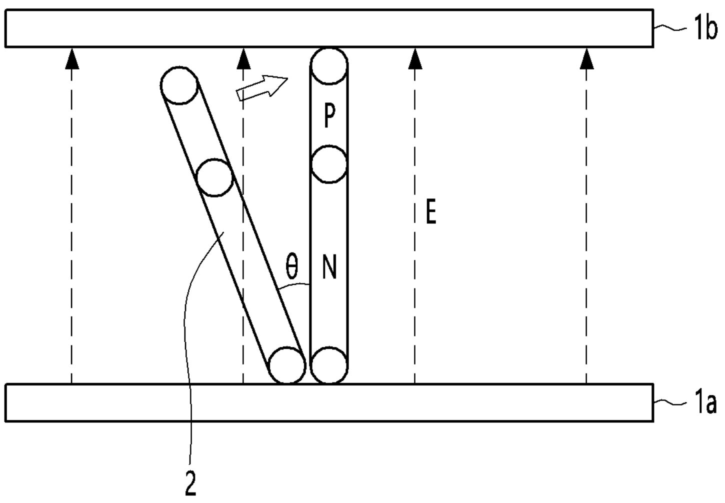
FIG. 1A and FIG. 1B show the state of aligning the light emitting elements.
Figure 1B:
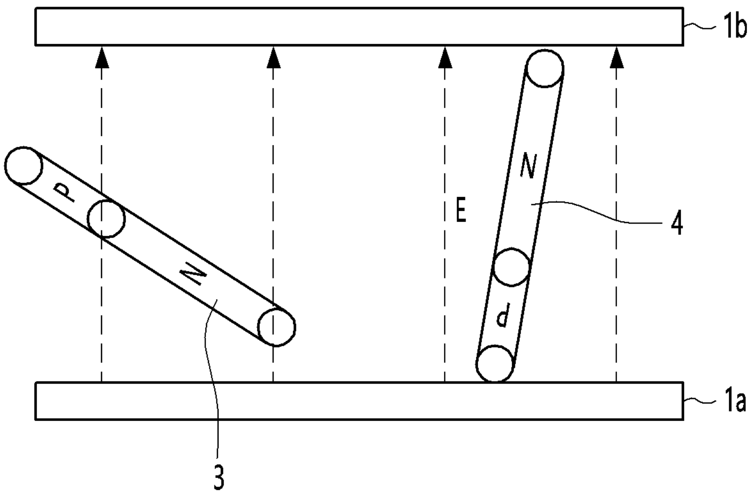
Figure 2:
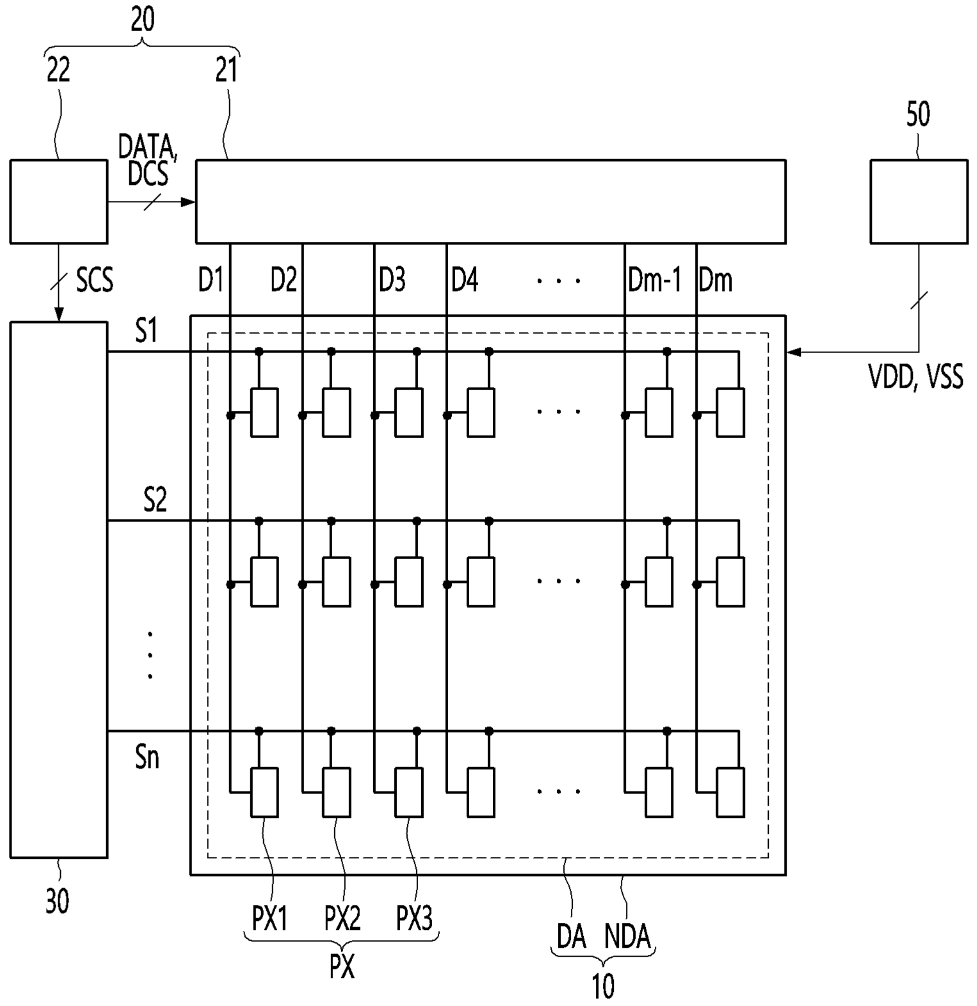
FIG. 2 is a schematic block diagram of a display device according to an embodiment.
Figure 3:
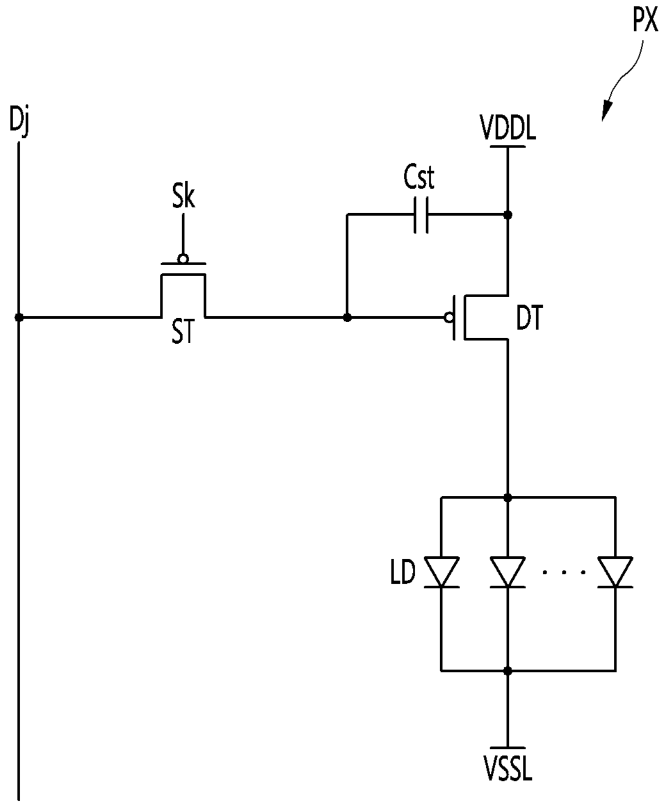
FIG. 3 is a circuit diagram illustrating an example of a pixel of FIG. 2.

FIG. 2 is a schematic block diagram of a display device according to an exemplary embodiment, and FIG. 3 is a circuit diagram illustrating an example of a pixel of FIG. 2.

Referring to FIG. 2 and FIG. 3, a display device according to an embodiment may comprise a display panel 10, a driving circuit 20, a scan driving circuit 30 and a power supply circuit 50.

The driving circuit 20 may include a data driving circuit 21 and a timing controller 22.

The display panel 10 may have a rectangular shape and a planar shape. The planar shape of the display panel 10 is not limited to the rectangular shape, and may be formed into polygonal, circular or elliptical shapes. At least one side of the display panel 10 may be formed to be bent with a predetermined curvature.

The display panel 10 may be divided into a display area DA and a non-display area NDA disposed around the display area DA. The display area DA is an area where the pixels PX are formed to display an image. The display panel 10 may comprise data lines (D1 to Dm, where m is an integer greater than or equal to 2), scan lines (S1 to Sn, where n is an integer greater than or equal to 2) crossing the data lines (D1 to Dm), a high potential voltage line VDDL supplied with a high potential voltage, a low potential voltage line VSSL supplied with a low potential voltage, and pixels PX connected to the data lines D1 to Dm and the scan lines S1 to Sn.

Each of the pixels PX may comprise a first sub-pixel PX1, a second sub-pixel PX2, and a third sub-pixel PX3. The first sub-pixel PX1 may emit a first color light, the second sub-pixel PX2 may emit of a second color light, and the third sub-pixel PX3 may emit a third color light. The first color light may be red light, the second color light may be green light, and the third color light may be blue light, but are not limited thereto. In addition, in FIG. 2, it is illustrated that each of the pixels PX comprise three sub-pixels, but are not limited thereto. That is, each of the pixels PX may comprise four or more sub-pixels.

Each of the first sub-pixel PX1, the second sub-pixel PX2, and the third sub-pixel PX3 may be connected to at least one of the data lines D1 to Dm, at least one of the scan lines S1 to Sn, and a high potential voltage line VDDL. As shown in FIG. 3, the first sub-pixel PX1 may include light emitting elements LDs, a plurality of transistors for supplying current to the light emitting elements LDs, and at least one capacitor.

Each of the light emitting elements LD may be an inorganic light emitting diode that includes a first electrode, an inorganic semiconductor, and a second electrode. Here, the first electrode may be an anode electrode, and the second electrode may be a cathode electrode.

The plurality of transistors may include a driving transistor DT supplying current to the light emitting elements LD and a scan transistor ST supplying a data voltage to a gate electrode of the driving transistor DT, as shown in FIG. 3. The driving transistor DT has a gate electrode connected to the source electrode of the scan transistor ST, a source electrode connected to the high potential voltage line VDDL to which a high potential voltage is applied, and a drain electrode connected to the first electrodes of the light emitting elements LD. The scan transistor ST has a gate electrode connected to the scan line (Sk, k is an integer that satisfies $1 \leq k \leq n$), a source electrode connected to the gate electrode of the driving transistor DT, and a drain electrode connected to the data lines (Dj, j an integer that satisfies $1 \leq j \leq m$).

The capacitor Cst is formed between the gate electrode and the source electrode of the driving transistor DT. The storage capacitor Cst stores a difference voltage between the gate voltage and the source voltage of the driving transistor DT.

The driving transistor DT and the scan transistor ST may be formed of a thin film transistor. In addition, in FIG. 3, the driving transistor DT and the scan transistor ST have been mainly described as being formed of P-type MOSFETs (Metal Oxide Semiconductor Field Effect Transistors), but are not limited thereto. The driving transistor DT and the scan transistor ST may be formed of N-type MOSFETs. In this case, positions of the source electrode and the drain electrode of each of the driving transistor DT and the scan transistor ST may be changed.

In addition, in FIG. 3, it is illustrated that each of the first sub-pixel PX1, the second sub-pixel PX2, and the third sub-pixel PX3 includes 2T1C (2 Transistor-1 capacitor) having one driving transistor DT, one scan transistor ST, and one capacitor Cst, but is not limited thereto. Each of the first sub-pixel PX1, the second sub-pixel PX2, and the third sub-pixel PX3 may include a plurality of scan transistors ST and a plurality of capacitors Cst.

Since the second sub-pixel PX2 and the third sub-pixel PX3 may be expressed with substantially the same circuit diagram as the first sub-pixel PX1, detailed descriptions will be omitted.

The driving circuit 20 outputs signals and voltages for driving the display panel 10. To this end, the driving circuit 20 may include a data driving circuit 21 and a timing controller 22.

The data driving circuit 21 receives digital video data DATA and a source control signal DCS from the timing controller 22. The data driving circuit 21 converts the digital video data DATA into analog data voltages according to the source control signal DCS and supplies them to the data lines D1 to Dm of the display panel 10.

The timing controller 22 receives digital video data DATA and timing signals from a host system. The timing signals may include a vertical synchronization signal, a horizontal synchronization signal, a data enable signal, and a dot clock. The host system may be an application processor of a smart phone or tablet PC, a system on chip of a monitor or TV, and the like.

The timing controller 22 generates control signals for controlling operation timings of the data driving circuit 21 and the scan driving circuit 30. The control signals may include a source control signal DCS for controlling the operation timing of the data driving circuit 21 and a scan control signal SCS for controlling the operation timing of the scan driving circuit 30.

The driving circuit 20 may be disposed in the non-display area NDA provided on one side of the display panel 10. The driving circuit 20 may be formed of an integrated circuit (IC) and mounted on the display panel 10 using a chip on glass (COG) scheme, a chip on plastic (COP) scheme, or an ultrasonic bonding scheme, but is not limited thereto. For example, the driving circuit 20 may be mounted on a circuit board (not shown) instead of the display panel 10.

The data driving circuit 21 may be mounted on the display panel 10 using a chip on glass (COG) scheme, a chip on plastic (COP) scheme, or an ultrasonic bonding scheme, and the timing controller 22 may be mounted on a circuit board.

The scan driving circuit 30 receives the scan control signal SCS from the timing controller 22. The scan driving circuit 30 generates scan signals according to the scan control signal SCS and supplies them to the scan lines S1 to Sn of the display panel 10. The scan driving circuit 30 may include a plurality of transistors and be formed in the non-display area NDA of the display panel 10. Alternatively, the scan driving circuit 30 may be formed as an integrated circuit, and in this case, it may be mounted on a gate flexible film attached to the other side of the display panel 10.

The circuit board may be attached to pads provided on one edge of the display panel 10 using an anisotropic conductive film. For this reason, the lead lines of the circuit board may be electrically connected to the pads. The circuit board may be a flexible printed circuit board, a printed circuit board, or a flexible film such as a chip on film. The circuit board may be bent under the display panel 10. Accordingly, one side of the circuit board may be attached to one edge of the display panel 10 and the other side may be disposed below the display panel 10 and connected to a system board on which a host system is mounted.

The power supply circuit 50 may generate voltages necessary for driving the display panel 10 from the main power supplied from the system board and supply the voltages to the display panel 10. For example, the power supply circuit 50 generates a high potential voltage VDD and a low potential voltage VSS for driving the light emitting elements LD of the display panel 10 from the main power supply to supply them to the high potential voltage line VDDL and the low potential voltage line VSSL. Also, the power supply circuit 50 may generate and supply driving voltages for driving the driving circuit 20 and the scan driving circuit 30 from the main power.

Figure 4:
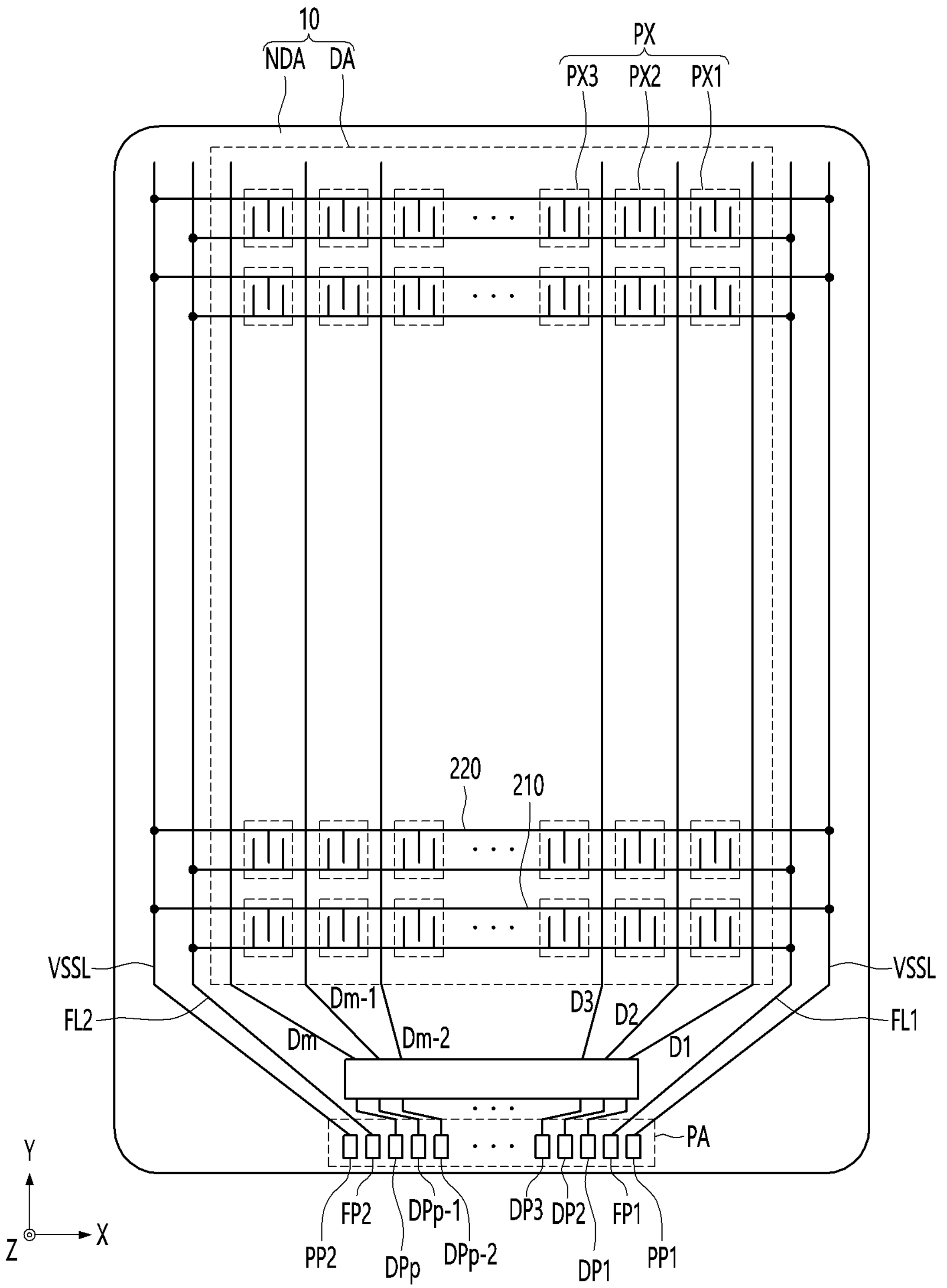
FIG. 4 is a plan view showing the display panel of FIG. 2 in detail.

FIG. 4 is a plan view showing the display panel of FIG. 2 in detail. In FIG. 4, for convenience of description, data pads (DP1 to $DP_p$, where p is an integer greater than or equal to 2), floating pads FD1 and FD2, power pads PP1 and PP2, floating lines FL1 and FL2, low potential voltage line VSSL, data lines D1 to Dm, first electrodes 260 and second electrodes 220 are shown.

Referring to FIG. 4, the data lines D1 to Dm, the first electrodes 210, the second electrodes 220, and the pixels PX may be disposed in the display area DA of the display panel 10.

The data lines D1 to Dm may extend long in the second direction (Y-axis direction). One sides of the data lines D1 to Dm may be connected to the driving circuit 20. For this reason, the data voltages of the driving circuit 20 may be applied to the data lines D1 to Dm.

The first electrodes 210 may be spaced apart from each other at predetermined intervals in the first direction (X-axis direction). For this reason, the first electrodes 210 may not overlap the data lines D1 to Dm. Among the first electrodes 210, the first electrodes 210 disposed on the right edge of the display area DA may be connected to the first floating line FL1 in the non-display area NDA. Among the first electrodes 210, the first electrodes 210 disposed at the left edge of the display area DA may be connected to the second floating line FL2 in the non-display area NDA.

Each of the second electrodes 220 may extend long in the first direction (X-axis direction). For this reason, the second electrodes 220 may overlap the data lines D1 to Dm. Also, the second electrodes 220 may be connected to the low potential voltage line VSSL in the non-display area NDA. For this reason, the low potential voltage of the low potential voltage line VSSL may be applied to the second electrodes 220.

Each of the pixels PX may comprise a first sub-pixel PX1, a second sub-pixel PX2, and a third sub-pixel PX3. The first sub-pixel PX1, the second sub-pixel PX2, and the third sub-pixel PX3 of each of the pixels PX may be arranged in regions defined in a matrix form by the first electrodes 210, the second electrodes 220, and data lines D1 to Dm. Although FIG. 4 illustrates that the pixel PX comprises three sub-pixels, it is not limited thereto, and each of the pixels PX may comprise four or more sub-pixels.

The first sub-pixel PX1, the second sub-pixel PX2, and the third sub-pixel PX3 of each of the pixels PX may be disposed in the first direction (X-axis direction), but are not limited thereto. That is, the first sub-pixel PX1, the second sub-pixel PX2, and the third sub-pixel PX3 of each of the pixels PX are disposed in the second direction (Y-axis direction) or in a zigzag shape and may be arranged in a variety of other forms.

The first sub-pixel PX1 may emit a first color light, the second sub-pixel PX2 may emit a second color light, and the third sub-pixel PX3 may emit a third color light. The first color light may be red light, the second color light may be green light, and the third color light may be blue light, but are not limited thereto.

In the non-display area NDA of the display panel 10, a pad part PA including data pads DP1 to $DP_p$, floating pads FD1 and FD2, and power pads PP1 and PP2, and a driving circuit 20, a first floating line FL1, a second floating line FL2, and a low potential voltage line VSSL may be disposed.

The pad part PA including the data pads DP1 to $DP_p$, the floating pads FD1 and FD2, and the power pads PP1 and PP2 may be disposed in one edge of the display panel 10, for example, an edge of the lower side. The data pads DP1 to $DP_p$, the floating pads FD1 and FD2, and the power pads PP1 and PP2 may be disposed side by side in the first direction (X-axis direction) of the pad part PA.

A circuit board may be attached using an anisotropic conductive film on the data pads DP1 to $DP_p$, the floating pads FD1 and FD2, and the power pads PP1 and PP2. Accordingly, the circuit board, the data pads DP1 to $DP_p$, the floating pads FD1 and FD2, and the power pads PP1 and PP2 may be electrically connected.

The driving circuit 20 may be connected to the data pads DP1 to $DP_p$ through the link lines LL. The driving circuit 20 may receive digital video data DATA and timing signals through the data pads DP1 to $DP_p$. The driving circuit 20 may convert the digital video data DATA into analog data voltages and supply them to the data lines D1 to Dm of the display panel 10.

The low potential voltage line VSSL may be connected to the first power pad PP1 and the second power pad PP2 of the pad part PA. The low potential voltage line VSSL may extend long in the second direction (Y-axis direction) in the non-display area NDA located in the left outside and the right outside of the display area DA. The low potential voltage line VSSL may be connected to the second electrode 220. For this reason, the low potential voltage of the power supply circuit 50 is applied to the second electrode 220 through the circuit board, the first power pad PP1, the second power pad PP2 and the low potential voltage line VSSL.

The first floating line FL1 may be connected to the first floating pad FD1 of the pad part PA. The first floating line FL1 may extend long in the second direction (Y-axis direction) in the non-display area NDA located in the left outside and the right outside of the display area DA.

The first floating pad FD1 and the first floating line FL1 may be dummy pads or dummy lines to which no voltage is applied.

The second floating line FL2 may be connected to the second floating pad FD2 of the pad part PA. The first floating line FL1 may extend long in the second direction (Y-axis direction) in the non-display area NDA located in the left outside and the right outside of the display area DA.

The second floating pad FD2 and the second floating line FL2 may be dummy pads or dummy lines to which no voltage is applied.

Meanwhile, since the light emitting elements (300 in FIG. 5) have a very small size, it is very difficult that they are mounted on the first sub-pixel PX1, the second sub-pixel PX2, and the third sub-pixel PX3 of each of the pixels PX.

In order to solve this problem, an alignment method using a dielectrophoresis scheme has been proposed.

That is, an electric field may be formed in each of the first sub-pixel PX1, the second sub-pixel PX2, and the third sub-pixel PX3 of the pixels PX to align the light emitting elements 300 during the manufacturing process. Specifically, the light emitting elements 300 may be aligned by applying a dielectrophoretic force to the light emitting elements 300 using a dielectrophoresis scheme during a manufacturing process.

However, during the manufacturing process, it is difficult to apply a ground voltage to the first electrodes 210 by driving the thin film transistors.

Therefore, in the manufactured display device, the first electrodes 210 may be spaced apart at predetermined intervals in a first direction (X-axis direction), but during the manufacturing process, the first electrodes 210 may be not disconnected in a first direction (X-axis direction) and n be extended and may be disposed to extend long.

For this reason, the first electrodes 210 may be connected to the first floating line FL1 and the second floating line FL2 during the manufacturing process. Therefore, the first electrodes 210 may receive a ground voltage through the first floating line FL1 and the second floating line FL2. Accordingly, by disconnecting the first electrodes 210 after aligning the light emitting elements 300 using a dielectrophoresis scheme during the manufacturing process, the first electrodes 210 may be spaced apart at predetermined intervals in the first direction (X-axis direction).

Meanwhile, the first floating line FL1 and the second floating line FL2 are lines for applying a ground voltage during a manufacturing process, and no voltage may be applied in the manufactured display device. Alternatively, the ground voltage may be applied to the first floating line FL1 and the second floating line FL2 to prevent static electricity in the manufactured display device.

Figure 5:
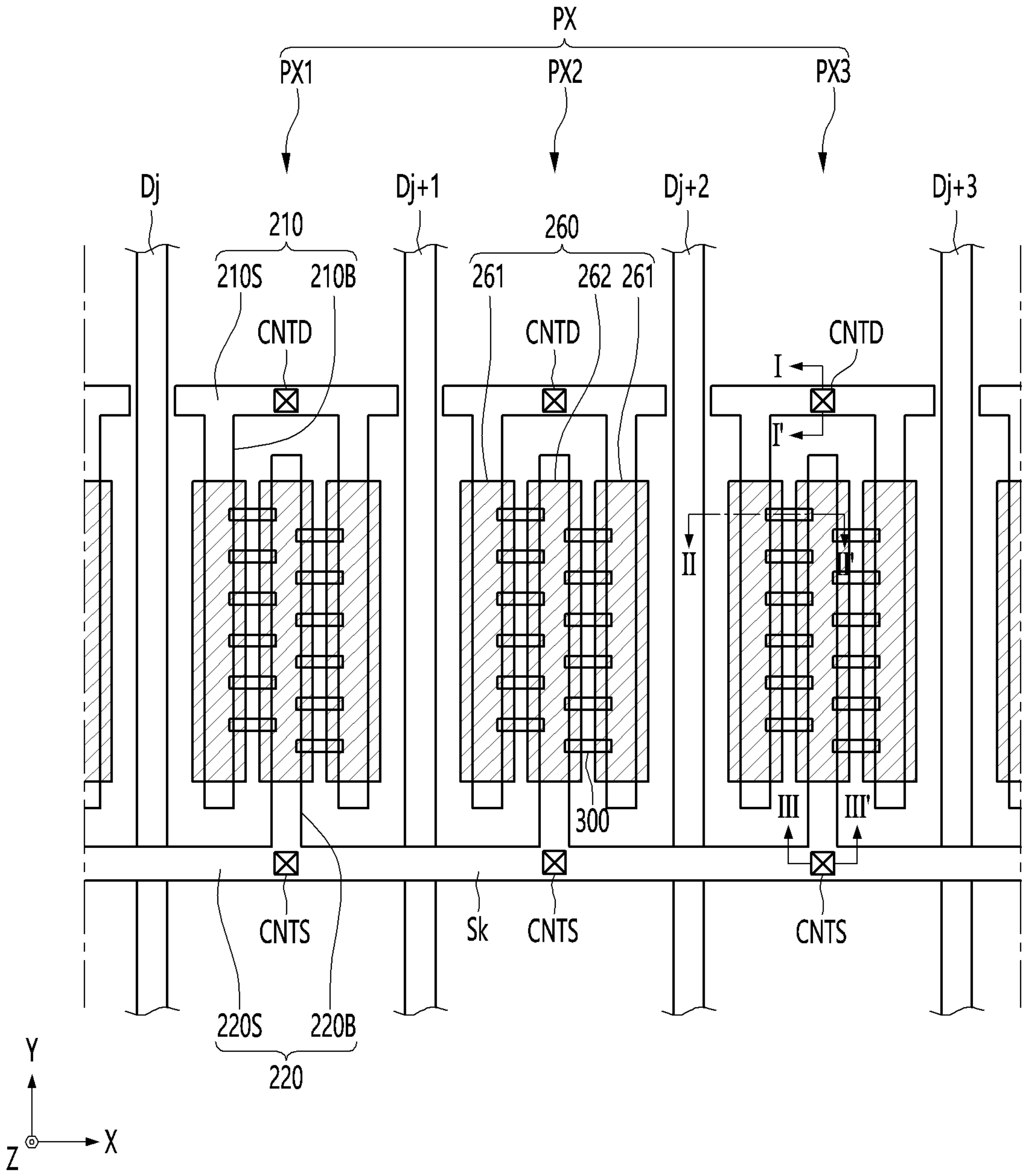
FIG. 5 is a plan view showing a pixel of the display area of FIG. 4 in detail.

FIG. 5 is a plan view showing a pixel of the display area of FIG. 4 in detail.

Referring to FIG. 5, the pixel PX may comprise a first sub-pixel PX1, a second sub-pixel PX2, and a third sub-pixel PX3. The first sub-pixel PX1, the second sub-pixel PX2, and the third sub-pixel PX3 of each of the pixels PX may be arranged in a matrix form in regions defined by the intersection structure of the scan lines Sk and the data lines Dj, Dj+1, and Dj+2, Dj+3.

The scan lines Sk may extend long in a first direction (X-axis direction), and the data lines Dj, Dj+1, Dj+2, and Dj+3 may extend long in the second direction (Y-axis direction) crossing the first direction (X-axis direction).

Each of the first sub-pixel PX1, the second sub-pixel PX2, and the third sub-pixel PX3 may comprise a first electrode 210, a second electrode 220, and a plurality of light emitting elements 300. The first electrode 210 and the second electrode 220 may be electrically connected to the light emitting elements 300 and may receive voltages to emit light of the light emitting element 300.

The first electrode 210 of any one sub-pixel among the first sub-pixel PX1, the second sub-pixel PX2, and the third sub-pixel PX3 may be spaced apart from the first electrode 210 of sub-pixel adjacent to the one sub-pixel. For example, the first electrode 210 of the first sub-pixel PX1 may be spaced apart from the first electrode 210 of the second sub-pixel PX2 adjacent thereto. Also, the first electrode 210 of the second sub-pixel PX2 may be spaced apart from the first electrode 210 of the third sub-pixel PX3 adjacent thereto. Also, the first electrode 210 of the third sub-pixel PX3 may be spaced apart from the first electrode 210 of the first sub-pixel PX1 adjacent thereto.

In contrast, the second electrode 220 of any one sub-pixel among the first sub-pixel PX1, the second sub-pixel PX2, and the third sub-pixel PX3 may be connected to the second electrode 220 of sub-pixel adjacent to the one sub-pixel. For example, the second electrode 220 of the first sub-pixel PX1 may be connected to the second electrode 210 of the adjacent second sub-pixel PX2. Also, the second electrode 220 of the second sub-pixel PX2 may be connected to the second electrode 220 of the third sub-pixel PX3 adjacent thereto. Also, the second electrode 220 of the third sub-pixel PX3 may be connected to the second electrode 220 of the first sub-pixel PX1 adjacent thereto.

In addition, during the manufacturing process, the first electrode 210 and the second electrode 220 may be used to form an electric field in each of the first sub-pixel PX1, the second sub-pixel PX2, and the third sub-pixel (PX3) to align the light emitting element 300. Specifically, the light emitting elements 300 may be aligned by applying a dielectrophoresis force to the light emitting elements 300 using a dielectrophoresis scheme during the manufacturing process. An electric field is formed by the voltage applied to the first electrode 210 and the second electrode 220, and a dielectrophoretic force is formed by the electric field such that the dielectrophoretic force can be applied to the light emitting element 300.

The first electrode 210 is an anode electrode connected to the second conductivity type semiconductor layer of the light emitting elements 300, and the second electrode 220 is a cathode electrode connected to the first conductivity type semiconductor layer of the light emitting elements 300. The first conductivity type semiconductor layer of the light emitting elements 300 may be an n-type semiconductor layer, and the second conductivity type semiconductor layer may be a p-type semiconductor layer. However, the present invention is not limited thereto, and the first electrode 210 may be a cathode electrode and the second electrode 220 may be an anode electrode.

The first electrode 210 may include a first electrode stem 210S extending long in a first direction (X-axis direction) and at least one first electrode branch 210B branching from the first electrode stem 210S in a second direction (Y-axis direction). The second electrode 220 may include a second electrode stem 220S extending long in a first direction (X-axis direction) and at least one second electrode branch 220B branching from the second electrode stem 220S in a second direction (Y-axis direction).

The first electrode stem 210S may be electrically connected to the thin film transistor 120 through the first electrode contact hole CNTD.

For this reason, the first electrode stem 210S may receive a predetermined driving voltage through the thin film transistor 120. The thin film transistor 120 to which the first electrode stem 210S is connected may be the driving transistor DT shown in FIG. 3.

The second electrode stem 220S may be electrically connected to the low potential auxiliary wire 161 through the second electrode contact hole CNTS.

Accordingly, the second electrode stem 220S may receive a low potential voltage of the low potential auxiliary wire 161. In FIG. 5, the second electrode stem 220S may be connected to the low potential auxiliary wire 161 through the second electrode contact hole CNTS in each of the first sub-pixel PX1, the second sub-pixel PX2, and the third sub-pixel PX3 of the pixel PX, but the present invention is not limited thereto. For example, the second electrode stem 220S may be connected to the low potential auxiliary wire 161 through the electrode contact hole CNTS in any one of the first sub-pixel PX1, the second sub-pixel PX2, and the third sub-pixel PX3 of the pixel PX. Alternatively, as shown in FIG. 4, since the second electrode stem 220S is connected to the low potential voltage line VSSL of the non-display area NDA, it may not be connected to the low potential auxiliary line 161. That is, the second electrode contact hole CNTS may be omitted.

The first electrode stem 210S of one sub-pixel may be disposed parallel to the first electrode stem 210S of sub-pixel adjacent to the one sub-pixel in a first direction (X-axis direction) in a first direction (X-axis direction). For example, the first electrode stem 210S of the first sub-pixel PX1 is disposed parallel to the first electrode stem 210S of the second sub-pixel PX2 in the first direction (X-axis direction). The first electrode stem 210S of the second sub-pixel PX2 is disposed parallel to the first electrode stem 210S of the third sub-pixel PX3 in the first direction (X-axis direction). The first electrode stem 210S of the third sub-pixel PX3 may be disposed parallel to the first electrode stem 210S of the first sub-pixel PX1 in the first direction (X-axis direction). This is because the first electrode stems 210S were connected as one during the manufacturing process, and then disconnected through a laser process after the light emitting elements 300 were aligned.

The second electrode branch 220B may be disposed between the first electrode branch 210B. The first electrode branches 210B may be symmetrically disposed with respect to the second electrode branches 220B. In FIG. 5, each of the first sub-pixel PX1, the second sub-pixel PX2, and the third sub-pixel PX3 of the pixel PX includes two first electrode branches 220B, but the present invention is not limited thereto. For example, each of the first sub-pixel PX1, the second sub-pixel PX2, and the third sub-pixel PX3 of the pixel PX may include three or more first electrode branches 220B.

In addition, in FIG. 5, each of the first sub-pixel PX1, the second sub-pixel PX2, and the third sub-pixel PX3 of the pixel PX includes one second electrode branch 220B, but the present invention is not limited thereto. For example, when each of the first sub-pixel PX1, the second sub-pixel PX2, and the third sub-pixel PX3 of the pixel PX includes a plurality of second electrode branches 220B, the first electrode branch 210B may be disposed between the second electrode branch 220B. That is, in each of the first sub-pixel PX1, the second sub-pixel PX2, and the third sub-pixel PX3 of the pixel PX, the first electrode branch 210B, the second electrode branch 220B, the first electrode branch 210B and the second electrode branch 220B may be sequentially arranged in the first direction (X-axis direction).

The plurality of light emitting elements 300 may be disposed between the first electrode branch 210B and the second electrode branch 220B. One end of at least one light emitting element 300 among the plurality of light emitting elements 300 is disposed to overlap the first electrode branch 210B, and the other end is disposed to overlap the second electrode branch 220B. A second conductivity type semiconductor layer, which is a p-type semiconductor layer, may be disposed at one end of each of the plurality of light emitting elements 300, and a first conductivity type semiconductor layer, which is an n-type semiconductor layer, may be disposed at the other end, but is not limited thereto. For example, a first conductivity type semiconductor layer, which is an n-type semiconductor layer, may be disposed at one end of the plurality of light emitting elements 300, and a second conductivity type semiconductor layer, which is a p-type semiconductor layer, may be disposed at the other end.

The plurality of light emitting elements 300 may be disposed substantially side by side in the first direction (X-axis direction). The plurality of light emitting elements 300 may be spaced apart from each other in the second direction (Y-axis direction). In this case, the spacing interval between the plurality of light emitting elements 300 may be different from each other. For example, some of the plurality of light emitting elements 300 may be adjacently disposed to form one group, and the remaining light emitting elements 300 may be adjacently disposed to form another group.

A connection electrode 260 may be disposed on the first electrode branch 210B and the second electrode branch 220B, respectively. The connection electrodes 260 may be disposed to extend long in the second direction (Y-axis direction) and spaced apart from each other in the first direction (X-axis direction). The connection electrode 260 may be connected to one end of at least one light emitting element 300 among the light emitting elements 300. The connection electrode 260 may be connected to the first electrode 210 or the second electrode 220.

The connection electrode 260 may include a first connection electrode 261 disposed on the first electrode branch 210B and connected to one end of at least one light emitting element 300 of the light emitting elements 300, and a second connection electrode 262 disposed on the branch portion 220B and connected to one end of at least one light emitting element 300 of the light emitting elements 300. For this reason, the first connection electrode 261 serves to electrically connect the plurality of light emitting elements 300 to the first electrode 210, and the second connection electrode 262 serves to electrically connect the plurality of light emitting elements 300 to the second electrode 220.

A width of the first connection electrode 261 in the first direction (X-axis direction) may be greater than a width of the first electrode branch 210B in the first direction (X-axis direction). Also, the width of the second connection electrode 262 in the first direction (X-axis direction) may be greater than the width of the second electrode branch 220B in the first direction (X-axis direction).

For example, each end of the light emitting elements 300 is disposed on the first electrode branch 210B of the first electrode 210 and the second electrode branch 220B of the second electrode 220, but due to an insulating layer (not shown) formed on the first electrode 210 and the second electrode 220, the light emitting element 300 may not be electrically connected to the first electrode 210 and the second electrode 220. Accordingly, portions of a side surface and/or an upper surface of the light emitting element 300 may be electrically connected to the first connection electrode 261 and the second connection electrode 262, respectively.

Meanwhile, the display device according to the embodiment uses a light emitting element as a light source. The light emitting element of the embodiment is a self-light emitting element that emits light by itself when electricity is applied, and may be a semiconductor light emitting element. Since the light emitting element of the embodiment is made of an inorganic semiconductor material, it is resistant to deterioration and has a semi-permanent lifespan such that it can contribute to realizing high-quality and high-definition image in a display device by providing stable light.

Figure 6:
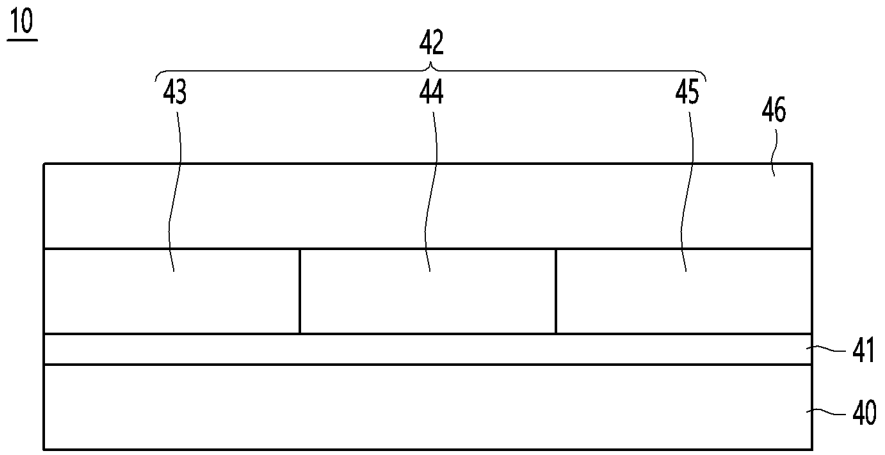
FIG. 6 is a schematic cross-sectional view of the display panel of FIG. 2.

FIG. 6 is a schematic cross-sectional view of the display panel of FIG. 2.

Referring to FIG. 6, the display panel 10 of the embodiment may comprise a first substrate 40, a light emitting unit 41, a color generating unit 42 and a second substrate 46. The display panel 10 of the embodiment may include more components than these, but is not limited thereto.

Although not shown, at least one or more insulating layers between the first substrate 40 and the light emitting unit 41, between the light emitting unit 41 and the color generating unit 42, and/or between the color generating unit 42 and the second substrate 46, but is not limited thereto.

The first substrate 40 may support the light emitting unit 41, the color generating unit 42, and the second substrate 46. The second substrate 46 may comprise various elements as described above. For example, the second substrate 46 may comprise the data lines (D1 to Dm, where m is an integer greater than or equal to 2), the scan lines S1 to Sn, the high potential voltage line VDDL and the low potential voltage line VSSL as shown in FIG. 2, a plurality of transistors and at least one capacitor as shown in FIG. 3, and a first electrode 210 and a second electrode 220 as shown in FIG. 4.

The first substrate 40 may be formed of glass, but is not limited thereto.

The light emitting unit 41 may provide light to the color generating unit 42. The light emitting unit 41 may include a plurality of light sources that emit light themselves by applying electricity. For example, the light source may include a light emitting element (300 in FIG. 5).

As an example, the plurality of light emitting elements 300 are disposed separately for each sub-pixel of a pixel, and may independently emit light by controlling each sub-pixel.

As another example, the plurality of light emitting elements 300 may be arranged regardless of pixel division and simultaneously emit light from all sub-pixels.

The light emitting element 300 of the embodiment may emit blue light, but is not limited thereto. For example, the light emitting element 300 of the embodiment may emit white light or purple light.

The color generating unit 42 may generate of a different color light from the light provided by the light emitting unit 41.

For example, the color generating unit 42 may include a first color generator 43, a second color generator 44, and a third color generator 45. The first color generator 43 may correspond to the first sub-pixel PX1 of the pixel, the second color generator 44 may correspond to the second sub-pixel PX2 of the pixel, and the third color generator 45 may correspond to the third sub-pixel PX3 of the pixel.

The first color generator 43 may generate first color light based on the light provided from the light emitting unit 41, and the second color generator 44 may generate second color light based on the light provided from the light emitting unit 41, and the third color generator 45 may generate third color light based on light provided from the light emitting unit 41. For example, the first color generator 43 may output blue light from the light emitting unit 41 as red light, and the second color generator 44 may output blue light from the light emitting unit 41 as green light, and the third color generator 45 may output blue light from the light emitting unit 41 as it is.

As an example, the first color generator 43 may include a first color filter, the second color generator 44 may include a second color filter, and the third color generator 45 may include a third color filter.

The first color filter, the second color filter, and the third color filter may be formed of a transparent material through which light can pass.

For example, at least one of the first color filter, the second color filter, and the third color filter may include a quantum dot.

The quantum dot of the embodiment may be selected from a group II-IV compound, a group IV-VI compound, a group IV element, a group IV compound, and a combination thereof.

The group II-VI compound may be selected the groups consisting of a binary compound selected from the group consisting of CdSe, CdTe, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof; and quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The group III-V compound may be selected the groups consisting of a binary compound selected from the group consisting of GaN, GaP, GaAs, GaSb, AlN, AlP, AlAs, AlSb, InN, InP, InAs, InSb and mixtures thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The group IV-VI compound may be selected the groups consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof.

The group IV element may be selected from the group consisting of Si, Ge, and mixtures thereof. The group IV compound may be a binary element compound selected from the group consisting of SiC, SiGe, and mixtures thereof.

Such quantum dot may have a full width of half maximum (FWHM) of an emission wavelength spectrum of approximately 45 nm or less, and light emitted through the quantum dot may be emitted in all directions. Accordingly, the viewing angle of the light emitting display device may be improved.

Meanwhile, the quantum dot may have a shape such as spherical, pyramidal, multi-arm, or cubic nanoparticles, nanotubes, nanowires, nanofibers, nanoplatelet particles, etc., but are not limited thereto.

For example, when the light emitting element 300 emits blue light, the first color filter may include red quantum dots, and the second color filter may include green quantum dots. The third color filter may not include quantum dots, but is not limited thereto. For example, blue light from the light emitting element 300 is absorbed by the first color filter, and the wavelength of the absorbed blue light is shifted by red quantum dots to output red light. For example, blue light from the light emitting element 300 is absorbed by the second color filter, and the wavelength of the absorbed blue light is shifted by green quantum dots to output green light. For example, blue light from the light emitting element 300 may be absorbed by the third color filter, and the absorbed blue light may be output as it is.

Meanwhile, when the light emitting element 300 emits white light, not only the first color filter and the second color filter, but also the third color filter may include quantum dots. That is, the wavelength of white light of the light emitting element 300 may be shifted to blue light by the quantum dots included in the third color filter.

For example, at least one of the first color filter, the second color filter, and the third color filter may include a phosphor.

For example, some of the first color filter, the second color filter, and the third color filter may include quantum dots, and others may include phosphors. For example, each of the first color filter and the second color filter may include a phosphor and a quantum dot. For example, at least one of the first color filter, the second color filter, and the third color filter may include scattering particles. Since blue light incident on each of the first color filter, the second color filter, and the third color filter is scattered by the scattering particles and the color of the scattered blue light is shifted by the corresponding quantum dots, light output efficiency may be improved.

As another example, the first color generator 43 may include a first color converter and a first color filter. The second color generator 44 may include a second color converter and a second color filter. The third color generator 45 may include a third color converter and a third color filter. Each of the first color converter, the second color converter, and the third color converter may be disposed adjacent to the light emitting unit 41. The first color filter, the second color filter and the third color filter may be disposed adjacent to the second substrate 46.

For example, the first color filter may be disposed between the first color converter and the second substrate 46. For example, the second color filter may be disposed between the second color converter and the second substrate 46. For example, the third color filter may be disposed between the third color converter and the second substrate 46.

For example, the first color filter may contact the upper surface of the first color converter and have the same size as the first color converter, but is not limited thereto. For example, the second color filter may contact the upper surface of the second color converter and have the same size as the second color converter, but is not limited thereto. For example, the third color filter may contact the upper surface of the third color converter and have the same size as the third color converter, but is not limited thereto.

For example, the first color converter may include red quantum dots, and the second color converter may include green quantum dots. The third color converter may not include quantum dots. For example, the first color filter may include a red-based material that selectively transmits the red light converted in the first color converter, and the second color filter may include a green-based material that selectively transmits the green light converted in the second color converter, and the third color filter may include a blue-based material that selectively transmits blue light transmitted as it is through the third color converter.

Meanwhile, when the light emitting element 300 emits white light, the third color converter as well as the first color converter and the second color converter may also include quantum dots. That is, the wavelength of white light of the light emitting element 300 may be shifted to blue light by the quantum dots included in the third color filter.

Referring back to FIG. 6, the second substrate 46 may be disposed on the color generating unit 42 to protect the color generating unit 42. The second substrate 46 may be formed of glass, but is not limited thereto.

The second substrate 46 may be called a cover window, cover glass, or the like.

The second substrate 46 may be formed of glass, but is not limited thereto.

The embodiment provides a display device capable of improving the degree of alignment of the light emitting element 300.

In general, a dielectrophoretic force using a dielectrophoresis scheme is formed between both electrodes, and the light emitting elements 300 may be aligned between the two electrodes by this dielectrophoretic force. However, the light emitting elements 300 positioned in a direction not affected by the dielectrophoretic force formed between both electrodes may be misaligned. Such misaligned light emitting elements 300 may not emit light, which may cause a decrease in luminance.

Hereinafter, various embodiments capable of improving the degree of alignment and securing high luminance will be described.

[Light-Emitting Element]

Figure 7:
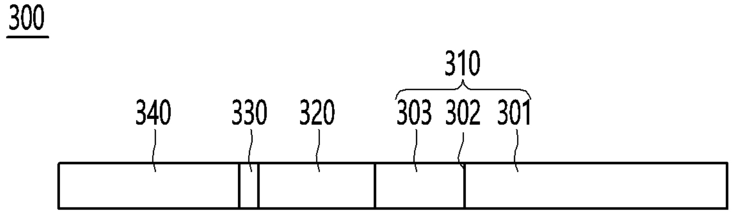
FIG. 7 shows a light emitting element according to the embodiment.

FIG. 7 shows a light emitting element according to the embodiment.

Referring to FIG. 7, the light emitting element 300 according to the embodiment may comprise a light emitting structure 310, at least one magnetic layer 330 and a blocking layer 340.

The light emitting structure 310 may emit light and may be made of a semiconductor material. For example, the light emitting structure 310 may comprise a first conductivity type semiconductor layer 301, an active layer 302 and a second conductivity type semiconductor layer 303. For example, the first conductivity type semiconductor layer 301, the active layer 302, and the second conductivity type semiconductor layer 303 may be sequentially disposed.

For example, the first conductivity type semiconductor layer 301 may be disposed below the active layer 302 and the second conductivity type semiconductor layer 303 may be disposed above the active layer 302. The first conductivity type semiconductor layer 301 may be an n-type semiconductor layer, and the second conductivity type semiconductor layer 303 may be a p-type semiconductor layer. However, the present invention is not limited thereto.

In the light emitting structure 10, a wavelength band of the emitted light may be changed according to a material constituting the active layer 302. In addition, selection of materials constituting the first conductivity type semiconductor layer 301 and the second conductivity type semiconductor layer 303 may be changed according to the material constituting the active layer 302. The light emitting structure 10 may be provided as a compound semiconductor. The light emitting structure 10 may be provided as a group II-VI or a group III-V compound semiconductor, for example. For example, the light emitting structure 10 may include at least two elements selected from aluminum (Al), gallium (Ga), indium (In), phosphorus (P), arsenic (As), and nitrogen (N).

The active layer 302 may generate light in the wavelength band determined by recombination of first carriers (eg, electrons) provided from the first conductivity type semiconductor layer 301 and second carriers (eg, holes) provided from the second conductivity type semiconductor layer 303. The active layer 302 may be provided with any one or more of a single well structure, a multi-well structure, a quantum dot structure, or a quantum wire structure. The active layer 302 may be provided as a compound semiconductor. The active layer 302 may be provided with, for example, a group II-VI or a group III-V compound semiconductor.

When light of an ultraviolet wavelength band, a blue wavelength band, or a green wavelength band is generated in the active layer 302, the active layer 302 may be provided as a semiconductor material having a composition formula of, for example, $In_xAl_yGa_{1-x-y}N$ ($0 \le x \le 1$, $0 \le y \le 1$, $0 \le x+y \le 1$). The active layer 302 may be selected from the group including, for example, InAlGaN, InAlN, InGaN, AlGaN, and GaN. When the active layer 302 is provided in a multi-well structure, the active layer 302 may be provided by stacking a plurality of barrier layers and a plurality of well layers therebetween.

The first conductivity type semiconductor layer 301 may be provided as a compound semiconductor. The first conductivity type semiconductor layer 301 may be provided as, for example, a group II-VI compound semiconductor or a group III-V compound semiconductor. For example, when light in the ultraviolet wavelength band, blue wavelength band, or green wavelength band is generated in the active layer 302, the first conductivity type semiconductor layer 301 may be provided as a semiconductor material having a composition formula of, for example, $In_xAl_yGa_{1-x-y}N$ ($0 \le x \le 1$, $0 \le y \le 1$, $0 \le x+y \le 1$). The first conductivity type semiconductor layer 301 may be selected from the group including, for example, GaN, AlN, AlGaN, InGaN, InN, InAlGaN, and AlInN, and an n-type dopant such as Si, Ge, Sn, Se, and Te may be doped.

The second conductivity type semiconductor layer 303 may be provided as a compound semiconductor. The second conductivity type semiconductor layer 303 may be provided as, for example, a group II-VI compound semiconductor or a group III-V compound semiconductor. For example, when light in an ultraviolet wavelength band, a blue wavelength band, or a green wavelength band is generated in the active layer 302, the second conductivity type semiconductor layer 303 may be provided as a semiconductor material having a composition formula of, for example, $In_xAl_yGa_{1-x-y}N$ ($0 \le x \le 1$, $0 \le y \le 1$, $0 \le x+y \le 1$). The second conductivity type semiconductor layer 303 may be selected from the group including, for example, GaN, AlN, AlGaN, InGaN, InN, InAlGaN, and AlInN, and a p-type dopant such as Mg, Zn, Ca, Sr, and Ba may be doped.

The magnetic layer 330 may be disposed adjacent to the second conductivity type semiconductor layer 303 of the light emitting structure 310. For example, the magnetic layer 330 may be disposed on the second conductivity type semiconductor layer 303. Although not shown, the magnetic layer 330 may contact the upper surface of the second conductivity type semiconductor layer 303.

The magnetic layer 330 may be made of a metal having a magnetic property. For example, the magnetic layer 330 may include nickel (Ni) or iron (Fe), but is not limited thereto. For example, the magnetic layer 330 may be an electrode that allows current to flow through the second conductivity type semiconductor layer 303. The magnetic layer 330 of the light emitting element 300 is electrically connected to a magnetic layer (430 in FIG. 8) to be described later, and the voltage applied through the magnetic layer 430 from the first electrode (410 in FIG. 8) may be transmitted to the second conductivity type semiconductor layer 303.

In contrast, when the magnetic layer 330 is disposed adjacent to the first conductivity type semiconductor layer 301, the magnetic layer 330 of the light emitting element 300 may transmit voltage applied from the second electrode 420 through the magnetic layer 430 to the first conductivity type semiconductor layer 301.

Figure 8:
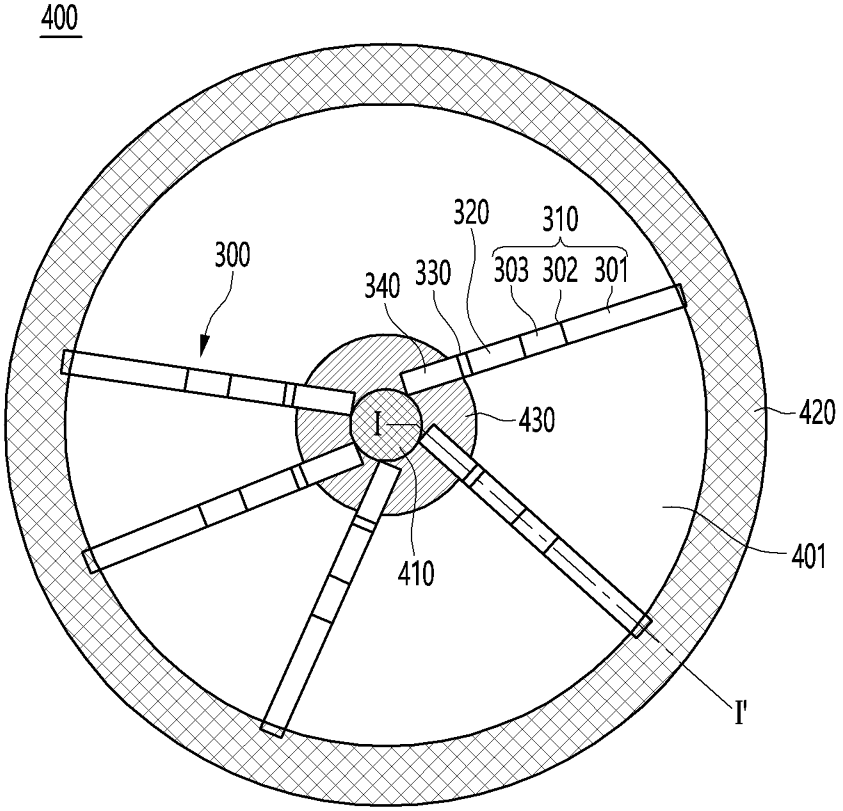
FIG. 8 is a plan view illustrating a display device according to a first embodiment.

Accordingly, the magnetic layer 330 may align the light emitting element 300 at a normal position of the substrate (401 in FIG. 8). That is, the magnetic layer 330 of the light emitting element 300 may be attached to the magnetic layer 430 by the magnetic force formed by the magnetic layer 430 provided on the substrate 401 such that the light emitting element 300 may be attached to the substrate 401.

Although not shown, the magnetic layer 330 may be disposed adjacent to the first conductivity type semiconductor layer 301 of the light emitting structure 310. That is, the magnetic layer 330 may be disposed on one side of the light emitting structure 310.

The blocking layer 340 may be disposed adjacent to the magnetic layer 330. For example, the blocking layer 340 may be disposed on the outer side of the magnetic layer 330. For example, when the magnetic layer 330 is disposed on the upper surface of the second conductivity type semiconductor layer 303, the blocking layer 340 may be disposed on the upper surface of the magnetic layer 330. For example, the blocking layer 340 may contact the upper surface of the magnetic layer 330.

When the light emitting element 300 is misaligned on the substrate 401, the blocking layer 340 prevents the magnetic layer 330 of the light emitting element 300 from being attached to the magnetic layer 430 of the substrate 401. For example, the thickness of the blocking layer 340 may be greater than that of the magnetic layer 330. For example, the thickness of the blocking layer 340 may be 3 to 10 times the thickness of the magnetic layer 330, but is not limited thereto. When the thickness of the blocking layer 340 is less than three times the thickness of the magnetic layer 330, when the light emitting element 300 is misaligned and disposed on the substrate 401, the thickness of the blocking layer 340 is small and the magnetic layer 330 of the light emitting element 300 may be attached to the magnetic layer 430 of the substrate 401. When the thickness of the blocking layer 340 exceeds 10 times the thickness of the magnetic layer 330, the thickness of the blocking layer 340 is thick, and thus the thickness of the display device may increase.

The blocking layer 340 may be made of an insulating material or a metal that does not have a magnetic property.

For example, when the blocking layer 340 and the magnetic layer 330 are made of a metal, current may flow into the second conductivity type semiconductor layer 303 via the blocking layer 340 and the magnetic layer 330. For example, when the blocking layer 340 is made of an insulating material, current may flow to the second conductivity type semiconductor layer 303 via the magnetic layer 330.

Meanwhile, the light emitting element 300 according to the embodiment may comprise a metal layer 320.

The metal layer 320 may be omitted. In this case, the magnetic layer 330 may contact the upper surface of the second conductivity type semiconductor layer 303.

The metal layer 320 may be made of a metal having excellent electrical conductivity. For example, the metal layer 320 may include gold (Au), but is not limited thereto. The metal layer 320 allows current to flow smoothly and minimizes current loss such that the luminance of the light emitting element 300 can be accurately controlled.

The metal layer 320 may be used to adjust the position of the active layer 302 along the entire length of the light emitting element 300. In general, since the thickness of the first conductivity type semiconductor layer 301 is greater than the thickness of the second conductivity type semiconductor layer 303, the active layer 302 may be located on the upper side of the entire area of the light emitting structure 310. By adjusting the thickness of the metal layer 320 in the light emitting element 300 including the metal layer 320, the active layer 302 may be located in the center or lower side of the entire area of the light emitting structure 310. Accordingly, the metal layer 320 may be called a dummy layer, a position control layer, or the like.

The First Embodiment

Figure 9:
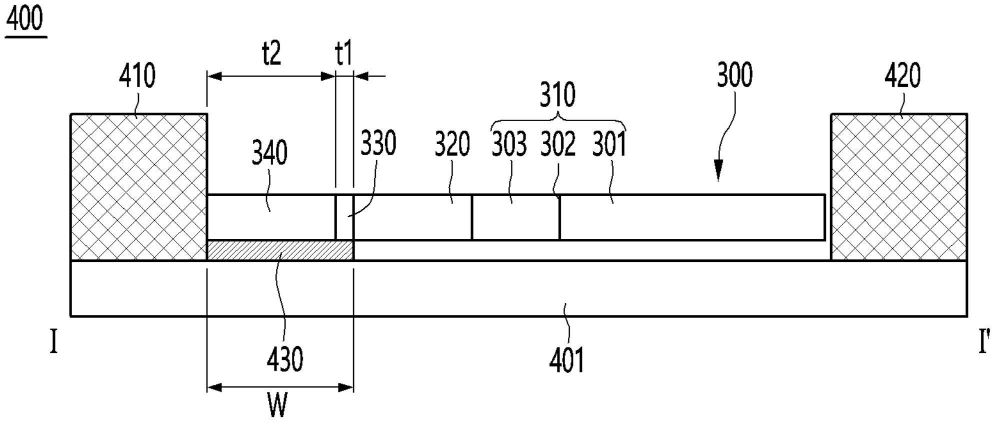
FIG. 9 is a cross-sectional view taken along line I-I' of FIG. 8.

FIG. 8 is a plan view illustrating a display device according to a first embodiment, and FIG. 9 is a cross-sectional view taken along line I-I' of FIG. 8.

Referring to FIG. 8 and FIG. 9, the display device 400 according to the first embodiment may comprise a substrate 401, a first electrode 410, a second electrode 420, a magnetic layer 430, and a plurality of light emitting elements 300.

The light emitting element 300 may be the light emitting element 300 shown in FIG. 7. Therefore, since the light emitting element 300 can be easily understood from the light emitting element 300 shown in FIG. 7, detailed descriptions will be omitted.

The substrate 401 may be the first substrate 40 shown in FIG. 6, but is not limited thereto. Therefore, since the substrate 401 can be easily understood from the first substrate 40 shown in FIG. 6, detailed descriptions will be omitted.

The substrate 401 may include a plurality of sub-pixels (PX1, PX2, and PX3 in FIG. 2).

For example, as shown in FIG. 2, a plurality of sub-pixels PX1, PX2, and PX3 may be defined by crossing a plurality of scan lines S1 to Sn and a plurality of data lines D1 to Dm. For example, the first sub-pixel PX1 may be defined by the crossing of the first scan line S1 and the first data line D1, and the second sub-pixel PX2 may be defined by the crossing of the first scan line S1 and the second data line D2, and the third sub-pixel PX3 may be defined by the crossing of the first scan line S1 and the third data line D3.

For example, the first sub-pixel PX1 may emit a first color light, the second sub-pixel PX2 may emit a second color light, and the third sub-pixel PX3 may emit a third color light. The first color light may be red light, the second color light may be green light, and the third color light may be blue light, but are not limited thereto. In addition, in FIG. 2, it is illustrated that each of the pixels PX includes three sub-pixels, but is not limited thereto. That is, each of the pixels PX may include four or more sub-pixels.

According to the embodiment, as shown in FIG. 6, a plurality of light emitting elements 300 emitting the same color light may be disposed in each of the sub-pixels PX1, PX2, and PX3. The first to third color light may be generated by the first color generator 43, the second color generator 44, and the third color generator 45 of the color generating unit 42 disposed on the light emitting element 300. For example, the light emitting element 300 may emit blue light, but is not limited thereto.

Unlike this, a plurality of first light emitting elements emitting a first color light are disposed in the first sub-pixel PX1, and a plurality of second light emitting elements emitting a second color light are disposed in the second sub-pixel PX2, and a plurality of third light emitting elements that emit a third color light may be disposed in the third sub-pixel PX3.

For example, the first color light may be emitted by the plurality of light emitting elements 300 and the first color generator 43 included in the first sub-pixel PX1. For example, the second color light may be emitted by the plurality of light emitting elements 300 and the second color generator 44 included in the second sub-pixel PX2. For example, the third color light may be emitted by the plurality of light emitting elements 300 and the third color generator 45 included in the third sub-pixel PX3.

For example, the first electrode 410 may be disposed at the center area of each of the sub-pixels PX1, PX2, and PX3, and the second electrode 420 may be disposed to be spaced apart from the first electrode 410 and surround the first electrode 410. For example, the first electrode 410 may have a dot shape. The first electrode 410 may have a circular shape, but is not limited thereto. For example, the second electrode 420 may have a closed loop structure surrounding the first electrode 410 at equal intervals from the first electrode 410, but is not limited thereto.

The first electrode 410 may be the first electrode 210 shown in FIG. 4 and the second electrode 420 may be the second electrode 220 shown in FIG. 4, but is not limited thereto.

The first electrode 410 and the second electrode 420 may be disposed in each sub-pixel PX1, PX2, and PX3.

A dielectrophoretic force may be formed between the first electrode 410 and the second electrode 420 by voltage applied to the first electrode 410 and the second electrode 420. The dielectrophoretic force may be radially formed by the arrangement structure of the first electrode 410 and the second electrode 420 described above. Accordingly, the plurality of light emitting elements 300 may be radially disposed between the first electrode 410 and the second electrode 420 according to the dielectrophoretic force. For example, one side of the light emitting element 300 may be disposed adjacent to the first electrode 410 and the other side of the light emitting element 300 may be disposed adjacent to the second electrode 420.

Accordingly, in each of the sub-pixels PX1, PX2, and PX3, the plurality of light emitting elements 300 may be radially disposed between the first electrode 410 and the second electrode 420.

Since the plurality of light emitting elements 300 are radially arranged, the active layer 302 generating light from the plurality of light emitting elements 300 may also be spaced apart from the first electrode 410 to have a closed loop structure. Accordingly, since light is emitted and collected along a closed loop in the active layer 302 of each of the plurality of light emitting elements 300, high luminance output light can be obtained by the plurality of light emitting elements 300.

Even if a plurality of light emitting elements 300 are arranged by the dielectrophoretic force between the first electrode 410 and the second electrode 420, some of the light emitting elements 300 are positioned in a direction not affected by the dielectrophoretic force. Thus, they may not be aligned between the first electrode 410 and the second electrode 420.

To solve this problem, the display device 400 according to the first embodiment may comprise a magnetic layer 430.

The magnetic layer 430 may align the light emitting element 300, which is not affected by dielectrophoretic force, between the first electrode 410 and the second electrode 420 by using an attraction by a magnetic field, that is, a magnetic force.

Therefore, according to the first embodiment, the light emitting element 300 may be primarily aligned by the dielectrophoretic force formed by the voltage applied between the first electrode 410 and the second electrode 420, and the light emitting elements 300 that are not aligned in the first alignment by the magnetic force of the magnetic layer 430 may be secondly aligned such that the degree of alignment of the light emitting elements 300 dropped to each sub-pixel PX1, PX2, and PX3 can be improved and high luminance can be secured.

That is, the light emitting element 300 normally aligned between the first electrode 410 and the second electrode 420 may emit light, and the light emitting element 300 otherwise may not emit light. As the number of light emitting elements 300 arranged in each sub-pixel PX1, PX2, and PX3 increases, the luminance of each sub-pixel PX1, PX2, and PX3 may increase. Accordingly, in order to increase the luminance of each sub-pixel PX1, PX2, PX3, The number of a light emitting element 300 aligned between the first electrode 410 and the second electrode 420 in each sub-pixel PX1, PX2, PX3 should be increased. As in the embodiment, by using the dielectrophoretic force formed between the first electrode 410 and the second electrode 420 and/or the magnetic layer 430 and the magnetic force between the magnetic layers 330 of the light emitting element 300 provided in each of the sub-pixels PX1, PX2, and PX3, the number of light emitting elements 300 aligned between the first electrode 410 and the second electrode 420 of each sub-pixel PX1, PX2, and PX3 is increased, that is, the degree of alignment is improved. Thus, the luminance of each of the sub-pixels PX1, PX2, and PX3 can be improved.

The magnetic layer 430 may be disposed between the first electrode 410 and the second electrode 420.

For example, the magnetic layer 430 may be disposed adjacent to the first electrode 410 or the second electrode 420 depending on the position of the magnetic layer 330 provided in the light emitting element 300 disposed between the first electrode 410 and the second electrode 420.

For example, when a positive (+) voltage is applied to the first electrode 410 and a negative (−) voltage is applied to the second electrode 420, the second conductivity type semiconductor layer 303 of the light emitting element 300 may be aligned adjacent to the first electrode 410 and the first conductivity type semiconductor layer 301 may be aligned adjacent to the second electrode 420. The first conductivity type semiconductor layer 301 may be an n-type semiconductor layer, and the second conductivity type semiconductor layer 303 may be a p-type semiconductor layer.

For example, as shown in FIG. 9, when the magnetic layer 330 is disposed adjacent to the second conductivity type semiconductor layer 303 of the light emitting element 300, the magnetic layer 430 may be disposed adjacent to the first electrode 410. Thus, the magnetic layer 330 disposed adjacent to the second conductivity type semiconductor layer 303 of the light emitting element 300 may be pulled by the magnetic layer 430 and attached to the magnetic layer 430.

For example, although not shown, when the magnetic layer 330 is disposed adjacent to the first conductivity type semiconductor layer 301 of the light emitting element 300, the magnetic layer 430 is disposed adjacent to the second electrode 420. Thus, the magnetic layer 330 disposed adjacent to the first conductivity type semiconductor layer 301 of the light emitting element 300 may be pulled by the magnetic layer 430 and attached to the magnetic layer 430.

The magnetic layer 430 may be made of a metal having a magnetic property. For example, the magnetic layer 430 may include nickel (Ni) or iron (Fe), but is not limited thereto.

The magnetic layer 430 may serve as an electrode for applying voltage to the light emitting element 300 as well as a magnetic body that causes attraction to act on the magnetic layer 330 of the light emitting element 300.

For example, the magnetic layer 430 may physically contact and be electrically connected to the first electrode 410. For example, the magnetic layer 430 may contact one side of the first electrode 410. For example, one side of the magnetic layer 430 may be in surface contact with one side of the first electrode 410. Due to the surface contact, the first electrode 410 and the magnetic layer 430 may be electrically connected.

For example, one side of the light emitting element 300 may be in contact with the upper surface of the magnetic layer 430. For example, the magnetic layer 330 of the light emitting element 300 may be pulled by the magnetic layer 430 provided on the substrate 401 and may come into contact with the upper surface of the magnetic layer 430.

While the magnetic layer 430 is fixed in contact with one side of the first electrode 410 and the upper surface of the substrate 401, the light emitting element 300 may be freely dropped on each of the sub-pixels PX1, PX2, and PX3. In this case, the freely-movable light emitting element 300 may contact the upper surface of the magnetic layer 430 and be aligned on the magnetic layer 430 by using the dielectrophoretic force between the first electrode 410 and the second electrode 420 and/or the magnetic force formed by the magnetic layer 430. The light emitting elements 300 aligned on the magnetic layer 430 may be maintained in a normal alignment state by the dielectrophoretic force between the first electrode 410 and the second electrode 420 and the magnetic force of the magnetic layer 430 and may be fixed to the upper surface of the magnetic layer 430.

For example, at least one side surface of the magnetic layer 330 of the light emitting element 300 may be in contact with the upper surface of the magnetic layer 430.

Meanwhile, the upper surface of the first electrode 410 may be positioned higher than the upper surface of the magnetic layer 430. This is to ensure that the light emitting element 300 disposed on the magnetic layer 430 does not deviate from a region between the first electrode 410 and the second electrode 420. That is, the light emitting element 300 disposed on the magnetic layer 430 is blocked by the side surface of the first electrode 410 extending upwardly from the upper surface of the magnetic layer 430 such that it may not move in an outward direction of the first electrode 410.

For example, the upper surface of the first electrode 410 may be positioned equal to or higher than an upper side of the light emitting element 300 disposed on the magnetic layer 430. Therefore, since the light emitting element 300 disposed on the magnetic layer 430 is positioned lower than the upper surface of the first electrode 410, a sense of stability can be given to the arrangement of the light emitting element 300.

For example, when the blocking layer 340 is disposed adjacent to the magnetic layer 330 in the light emitting element 300, the blocking layer 340 and the magnetic layer 330 of the light emitting element 300 may be disposed on the magnetic layer 430. That is, for example, the upper surface of a first portion of the magnetic layer 430 and one side surface of the blocking layer 340 are in contact with each other and the upper surface of a second portion extending in the horizontal direction from the first portion of the magnetic layer 430 and the magnetic layer 330 are in contact with each other.

To this end, the width W of the magnetic layer 430 may be greater than or equal to the sum of the thickness t1 of the magnetic layer 330 and the thickness t2 of the blocking layer 340 of the light emitting element 300.

For example, when the light emitting element 300 is disposed on the magnetic layer 430, one surface of the blocking layer 340 of the light emitting element 300 may be in contact with the side surface of the first electrode 410, but is limited thereto.

Figure 10:
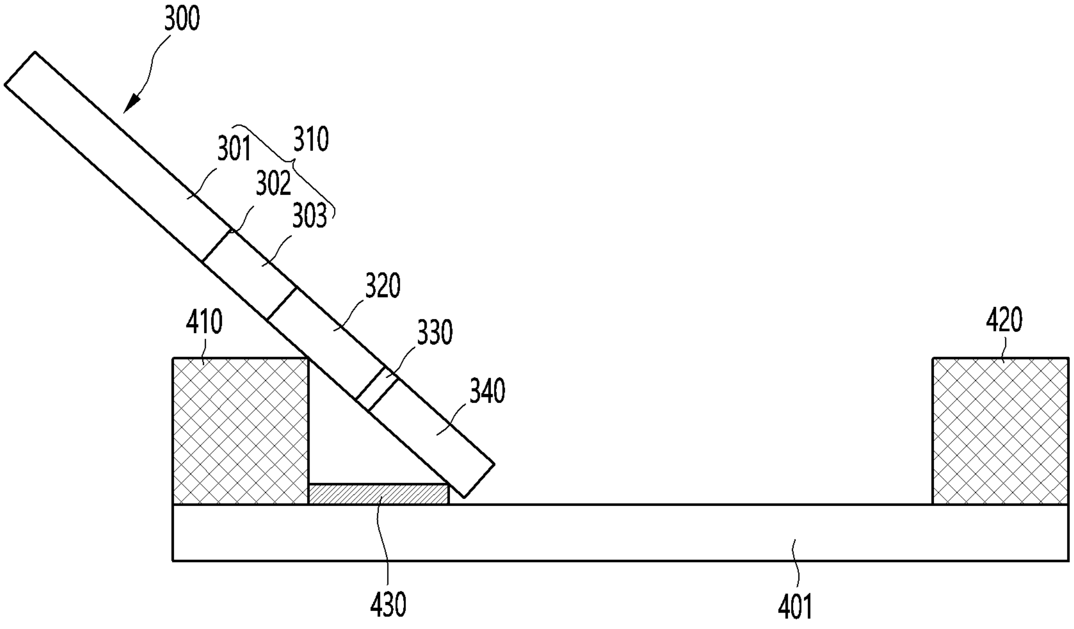
FIG. 10 shows an arrangement when a light emitting element is out of alignment.

Meanwhile, as shown in FIG. 10, misalignment of the light emitting element 300 may occur. If the light emitting element 300 does not have the blocking layer 340, the magnetic layer 330 of the light emitting element 300 may be attached to the magnetic layer 430. Even if the magnetic layer 330 of the light emitting element 300 is attached to the magnetic layer 430, since the light emitting element 300 is vertically disposed, the first conductivity type semiconductor layer 301 of the light emitting element 300 is not disposed adjacent to the second electrode 420 such that the corresponding light emitting element 300 cannot emit light.

It is preferable to collect and reuse the misaligned light emitting elements 300 in order to reduce manufacturing costs. However, since the magnetic layer 330 of the misaligned light emitting element 300 is firmly fixed to the magnetic layer 430 by magnetic force, it is not easy to collect the misaligned light emitting element 300.

In the embodiment, a blocking layer 340 having a predetermined thickness may be provided adjacent to the magnetic layer 330 of the light emitting element 300. Accordingly, even if the magnetic layer 330 of the misaligned light emitting element 300 tries to stick to the magnetic layer 430, the blocking layer 340 disposed on the upper side of the magnetic layer 330 prevents the magnetic layer 330 from sticking to the magnetic layer 430. That is, since the blocking layer 340 of the light emitting element 300 comes into contact with the magnetic layer 430 first, the magnetic layer 330 of the light emitting element 300 is not attached to the magnetic layer 430 and is positioned apart from each other by a certain distance. Since the magnetic layer 330 of the light emitting element 300 is not attached to the magnetic layer 430, the misaligned light emitting element 300 can be collected using a magnet. In order to increase the collection rate, ultrasonic vibration may be applied to the misaligned light emitting element 300 to increase the degree of freedom of the misaligned light emitting element 300, and then the misaligned light emitting element 300 may be collected using the magnet.

The Second Embodiment

Figure 11:
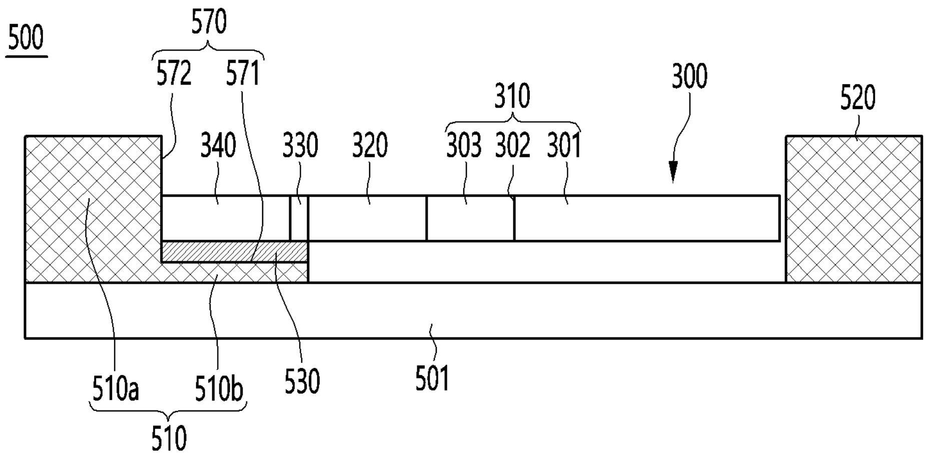
FIG. 11 is a cross-sectional view of a display device according to a second embodiment.

FIG. 11 is a cross-sectional view of a display device according to a second embodiment.

In the second embodiment, the arrangement of the first electrode 510 and the second electrode 520 may be the same as that of the first embodiment (FIG. 8).

Descriptions omitted in the second embodiment below can be easily understood from the first embodiment.

Referring to FIG. 11, a display device 500 according to a second embodiment may comprise a substrate 501, a first electrode 510, a second electrode 520, a magnetic layer 530, and a plurality of light emitting elements 300.

The light emitting element 300 may be the light emitting element 300 shown in FIG. 7. Therefore, since the light emitting element 300 can be easily understood from the light emitting element 300 shown in FIG. 7, detailed descriptions will be omitted.

The substrate 501 may be the first substrate 40 shown in FIG. 6, but is not limited thereto. Therefore, since the substrate 501 can be easily understood from the first substrate 40 shown in FIG. 6, detailed descriptions will be omitted.

The substrate 501 may include a plurality of sub-pixels (PX1, PX2, and PX3 in FIG. 2). Since each of the plurality of sub-pixels PX1, PX2, and PX3 has been described in detail in the first embodiment, related descriptions will be omitted.

The first electrode 510 may include a seating portion 570 having a step therein. The magnetic layer 530 may be disposed on a bottom surface 571 of the seating portion 570. For example, a lower surface of the magnetic layer 530 may contact the bottom surface 571 of the seating portion 570, and one side surface of the magnetic layer 530 may come into contact with the inner surface 572 of the seating portion 570.

As such, the lower surface of the magnetic layer 530 may be in contact with the bottom surface 571 of the seating portion 570 such that a contact area between the magnetic layer 530 and the first electrode 510 may be maximized. Accordingly, by minimizing contact resistance between the magnetic layer 530 and the first electrode 510, the voltage of the first electrode 510 can be easily applied to the light emitting element 300 through the magnetic layer 530.

One side of the light emitting element 300 may be disposed on the magnetic layer 530. For example, the magnetic layer 330 and the blocking layer 340 of the light emitting element 300 may be disposed on the magnetic layer 530.

For example, the first electrode 510 may include a first electrode portion 510*a* and a second electrode portion 510*b*. The first electrode portion 510*a* and the second electrode portion 510*b* may be integrally formed of a metal, but are not limited thereto.

For example, the second electrode portion 510*b* may extend toward the second electrode 520 from the first electrode portion 510*a*. That is, the first electrode portion 510*a* may be positioned away from the second electrode 520, and the second electrode portion 510*b* may be positioned closer to the second electrode 520. For example, the second electrode portion 510*b* may be located closer to the second electrode 520 than the first electrode portion 510*a*.

For example, the second electrode portion 510*b* may have the upper surface than the upper surface of the first electrode 510. An inner surface of the first electrode portion 510*a* may be an inner surface 572 of the seating portion 570, and an upper surface of the second electrode portion 510*b* may be a bottom surface 571 of the seating portion 570.

For example, the magnetic layer 530 may be disposed on the second electrode portion 510*b* of the first electrode 510. For example, the magnetic layer 530 may contact the upper surface of the second electrode portion 510*b* of the first electrode 510. For example, the magnetic layer 530 may vertically overlap the second electrode portion 510*b* of the first electrode 510.

For example, the magnetic layer 530 may be disposed on the first electrode portion 510*a* of the first electrode 510. For example, the magnetic layer 530 may contact an inner surface of the first electrode portion 510*a* of the first electrode 510. For example, the magnetic layer 530 may horizontally overlap the first electrode portion 510*a* of the first electrode 510.

For example, the upper surface of the first electrode portion 510*a* of the first electrode 510 may be positioned higher than the upper surface of the magnetic layer 530.

The plurality of light emitting elements 300 may be aligned between the first electrode 510 and the second electrodes 520 by using the dielectrophoretic force formed between the first electrode 510 and the second electrode 520 and/or the magnetic force formed by the magnetic layer 530. One side of each of the aligned plurality of light emitting elements 300 may be positioned on the magnetic layer 530. That is, the blocking layer 340 and the magnetic layer 330 of the light emitting element 300 may be positioned on the magnetic layer 530.

Accordingly, voltage applied to the first electrode 510 may be applied to the magnetic layer 330 of the light emitting element 300 via the magnetic layer 530.

The blocking layer 340 of the light emitting element 300 may vertically overlap the magnetic layer 530, and the magnetic layer 330 of the light emitting element 300 may vertically overlap the magnetic layer 530. The blocking layer 340 and the magnetic layer 330 of the light emitting element 300 may vertically overlap the second electrode portion 510*b* of the first electrode 510, respectively.

When the blocking layer 340 of the light emitting element 300 is made of metal, since both the blocking layer 340 and the magnetic layer 330 of the light emitting element 300 are in contact with the magnetic layer 530, voltage is applied from the second electrode portion 510*b* of the first electrode 510 to the blocking layer 340 and the magnetic layer 330 of the light emitting element 300. Thus, current flows more smoothly to the light emitting element 300, and high output light can be obtained by driving at a low voltage.

For example, an upper surface of the first electrode portion 510*a* of the first electrode 510 may be positioned equal to or higher than an upper side of the light emitting element 300 disposed on the magnetic layer 530.

The Third Embodiment

Figure 12:
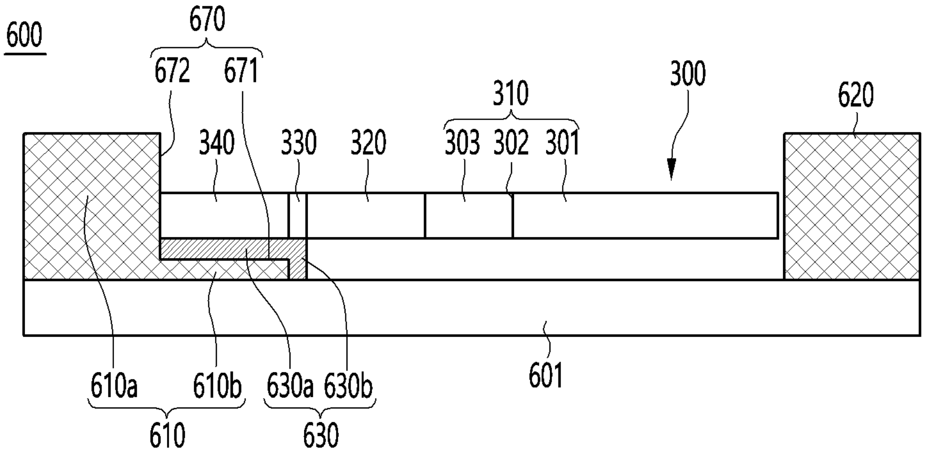
FIG. 12 is a cross-sectional view of a display device according to a third embodiment.

FIG. 12 is a cross-sectional view of a display device according to a third embodiment.

In the third embodiment, the arrangement of the first electrode 610 and the second electrode 620 may be the same as that of the first embodiment (FIG. 8).

Descriptions omitted in the following third embodiment can be easily understood from the first or second embodiment.

Referring to FIG. 12, a display device 600 according to a third embodiment may comprise a substrate 601, a first electrode 610, a second electrode 620, a magnetic layer 630, and a plurality of light emitting elements 300.

The light emitting element 300 may be the light emitting element 300 shown in FIG. 7. Therefore, since the light emitting element 300 can be easily understood from the light emitting element 300 shown in FIG. 7, detailed descriptions will be omitted.

The substrate 601 may be the first substrate 40 shown in FIG. 6, but is not limited thereto. Therefore, since the substrate 601 can be easily understood from the first substrate 40 shown in FIG. 6, detailed descriptions will be omitted.

The substrate 601 may include a plurality of sub-pixels (PX1, PX2, and PX3 in FIG. 2). Since each of the plurality of sub-pixels PX1, PX2, and PX3 has been described in detail in the first embodiment, related descriptions will be omitted.

The first electrode 610 may include a seating portion 670 having a step therein. The magnetic layer 630 may be disposed on the bottom surface 671 of the seating portion 670. For example, the lower surface of the magnetic layer 630 may contact the bottom surface 671 of the seating portion 670, and one side surface of the magnetic layer 630 may come into contact with the inner surface 672 of the seating portion 670.

According to the third embodiment, the lower surface of the magnetic layer 630 may be in contact with the bottom surface 671 of the seating portion 670 such that the contact area between the magnetic layer 630 and the first electrode 610 can be maximized. Accordingly, contact resistance between the magnetic layer 630 and the first electrode 610 is minimized and then, voltage of the first electrode 610 can be easily applied to the light emitting element 300 through the magnetic layer 630.

One side of the light emitting element 300 may be disposed on the magnetic layer 630. For example, the magnetic layer 330 and the blocking layer 340 of the light emitting element 300 may be disposed on the magnetic layer 630.

For example, the first electrode 610 may include a first electrode portion 610*a* and a second electrode portion 610*b*. The first electrode portion 610*a* and the second electrode portion 610*b* may be integrally formed of a metal, but are not limited thereto.

For example, the second electrode portion 610*b* may extend toward the second electrode 620. That is, the first electrode portion 610*a* may be positioned away from the second electrode 620 and the second electrode portion 610*b* may be positioned closer to the second electrode 620. For example, the second electrode portion 610*b* may be located closer to the second electrode 620 than the first electrode portion 610*a*.

For example, the second electrode portion 610*b* may have the upper surface than the upper surface of the first electrode 610. An inner surface of the first electrode portion 610*a* may be an inner surface 672 of the seating portion 670, and the upper surface of the second electrode portion 610*b* may be a bottom surface 671 of the seating portion 670.

For example, the magnetic layer 630 may be disposed on the first electrode portion 610*a* of the first electrode 610. For example, the magnetic layer 630 may contact the inner surface of the first electrode portion 610*a* of the first electrode 610. For example, the magnetic layer 630 may horizontally overlap the first electrode portion 610*a* of the first electrode 610.

For example, the upper surface of the first electrode portion 610*a* of the first electrode 610 may be positioned higher than the upper surface of the magnetic layer 630.

For example, the magnetic layer 630 may surround the second electrode portion 610*b* of the first electrode 610. For example, the magnetic layer 630 may contact the upper surface and the side surface of the second electrode portion 610*b* of the first electrode 610. For example, the magnetic layer 630 may vertically and horizontally overlap the second electrode portion 610*b* of the first electrode 610.

The magnetic layer 630 may include a first magnetic portion 630*a* and a second magnetic portion 630*b*.

For example, the first magnetic portion 630*a* may be disposed on the upper surface of the second electrode portion 610*b* of the first electrode 610. The second magnetic portion 630*b* may extend from the first magnetic portion 630*a* toward the second electrode 620 and may be disposed on the side surface of the second electrode portion 610*b* of the first electrode 610.

For example, the first magnetic portion 630*a* vertically overlaps the second electrode portion 610*b* of the first electrode 610, and the second magnetic portion 630*b* may overlap horizontally the second electrode portion 610*b* of the first electrode 610.

According to the third embodiment, since the magnetic layer 630 surrounds the second electrode portion 610*b* of the first electrode 610, it is possible to prevent the first electrode 610 from being separated from the substrate 601.

According to the third embodiment, the magnetic layer 630 may be in contact with the side surface as well as the upper surface of the second electrode portion 610*b* of the first electrode 610 such that the contact area between the magnetic layer 630 and the second electrode portion 610*b* of the first electrode 610 can be maximized. Accordingly, contact resistance between the magnetic layer 630 and the first electrode 610 is minimized and then, voltage of the first electrode 610 can be easily applied to the light emitting element 300 through the magnetic layer 630.

The plurality of light emitting elements 300 may be aligned between the first electrode 610 and the second electrodes 620 by using the dielectrophoretic force formed between the first electrode 610 and the second electrode 620 and/or the magnetic force formed by the magnetic layer 630.

One side of each of the aligned plurality of light emitting elements 300 may be positioned on the magnetic layer 630. That is, the blocking layer 340 and the magnetic layer 330 of the light emitting element 300 may be positioned on the magnetic layer 630.

For example, the blocking layer 340 of the light emitting element 300 may be in contact with the upper surface of the first magnetic portion 630*a* of the magnetic layer 630, and the magnetic layer 330 of the light emitting element 300 may contact the upper surface of the magnetic portion 630*b* of the magnetic layer 630.

Accordingly, voltage applied to the first electrode 610 may be applied to the magnetic layer 330 of the light emitting element 300 via the second magnetic portion 630*b* of the magnetic layer 630.

The blocking layer 340 of the light emitting element 300 may vertically overlap the magnetic layer 630, and the magnetic layer 330 of the light emitting element 300 may vertically overlap the magnetic layer 630. The blocking layer 340 and the magnetic layer 330 of the light emitting element 300 may vertically overlap the second electrode portion 610*b* of the first electrode 610.

When the blocking layer 340 of the light emitting element 300 is made of metal, both the blocking layer 340 and the magnetic layer 330 of the light emitting element 300 may be in contact with the magnetic layer 630 such that voltage may be applied to the blocking layer 340 and the magnetic layer 330 of the light emitting element 300 from the second electrode portion 610*b* of the first electrode 610. Accordingly, current flows more smoothly to the light emitting element 300 and high output light can be obtained by driving at a low voltage.

For example, the upper surface of the first electrode portion 610*a* of the first electrode 610 may be positioned equal to or higher than the upper side of the light emitting element 300 disposed on the magnetic layer 630.

The Fourth Embodiment

Figure 13:
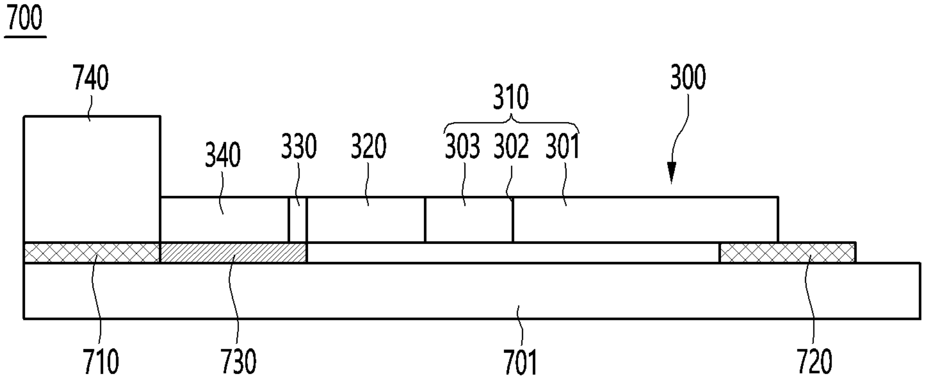
FIG. 13 is a cross-sectional view of a display device according to a fourth embodiment.

FIG. 13 is a cross-sectional view of a display device according to a fourth embodiment.

In the fourth embodiment, the arrangement of the first electrode 710 and the second electrode 720 may be the same as that of the first embodiment (FIG. 8).

Descriptions omitted in the fourth embodiment below can be easily understood from the first embodiment.

Referring to FIG. 13, a display device 700 according to a fourth embodiment may comprise a substrate 701, a first electrode 710, a second electrode 720, a magnetic layer 730, a blocking layer 740, and a plurality of light emitting elements 300.

The light emitting element 300 may be the light emitting element 300 shown in FIG. 7. Therefore, since the light emitting element 300 can be easily understood from the light emitting element 300 shown in FIG. 7, detailed descriptions will be omitted.

The substrate 701 may be the first substrate 40 shown in FIG. 6, but is not limited thereto. Therefore, since the substrate 701 can be easily understood from the first substrate 40 shown in FIG. 6, detailed descriptions will be omitted.

The substrate 701 may include a plurality of sub-pixels (PX1, PX2, and PX3 in FIG. 2). Since each of the plurality of sub-pixels PX1, PX2, and PX3 has been described in detail in the first embodiment, related descriptions will be omitted.

The magnetic layer 730 may be disposed between the first electrode 710 and the second electrode 720. For example, the magnetic layer 730 may be disposed adjacent to the first electrode 710 between the first electrode 710 and the second electrode 720. For example, the magnetic layer 730 may physically contact and be electrically connected to the first electrode 710 between the first electrode 710 and the second electrode 720.

The first electrode 710 and the magnetic layer 730 may be disposed on the same surface, but is not limited thereto. The first electrode 710 and the magnetic layer 730 may contact the upper surface of the substrate 701.

Meanwhile, the blocking layer 740 may be disposed on the first electrode 710. Although the drawing shows that the blocking layer 740 is disposed on the entire upper surface of the first electrode 710, the blocking layer 740 may be disposed on a part of the upper surface of the first electrode 710.

The blocking layer 740 may be positioned higher than the upper surface of the magnetic layer 730. The blocking layer 740 may be made of an insulating material or a metal.

The blocking layer 740 may serve to prevent the magnetic layer 330 of the misaligned light emitting element 300 from being attached to the magnetic layer 730. To this end, the blocking layer 740 may be thicker than the magnetic layer 730. For example, the thickness of the blocking layer 740 may be 3 to 10 times greater than the thickness of the magnetic layer 730, but is not limited thereto. When the thickness of the blocking layer 740 is less than 3 times the thickness of the magnetic layer 730 and the light emitting element 300 is misaligned and disposed on the substrate 701, the thickness of the blocking layer 740 is small such that the magnetic layer 330 of the light emitting element 300 may be attached to the magnetic layer 730 of the substrate 701. When the thickness of the blocking layer 740 exceeds 10 times the thickness of the magnetic layer 730, the thickness of the blocking layer 740 is thick, and thus the thickness of the display device 700 may increase.

The plurality of light emitting elements 300 may be aligned between the first electrode 710 and the second electrodes 720 by using the dielectrophoretic force formed between the first electrode 710 and the second electrode 720 and/or the magnetic force formed by the magnetic layer 730. One side of each of the aligned plurality of light emitting elements 300 may be positioned on the magnetic layer 730. That is, the blocking layer 340 and the magnetic layer 330 of the light emitting element 300 may be positioned on the magnetic layer 730.

For example, the blocking layer 340 of the light emitting element 300 may be in contact with the upper surface of the first magnetic portion 630*a* of the magnetic layer 730, and the magnetic layer 330 of the light emitting element 300 may be in contact with the upper surface of the magnetic layer 730.

Accordingly, voltage applied to the first electrode 710 may be applied to the magnetic layer 330 of the light emitting element 300 via the magnetic layer 730.

Each of the magnetic layer 330 and the blocking layer 340 of the light emitting element 300 may vertically overlap the magnetic layer 730.

When the blocking layer 340 of the light emitting element 300 is made of metal, both the blocking layer 340 and the magnetic layer 330 of the light emitting element 300 may be in contact with the magnetic layer 730 such that voltage of the first electrode 710 may be applied to the blocking layer 340 and the magnetic layer 330 of the light emitting element 300 via the magnetic layer 730. Accordingly, current flows more smoothly to the light emitting element 300 and high output light can be obtained by driving at a low voltage.

For example, the upper surface of the blocking layer 740 may be positioned equal to or higher than the upper surface of the light emitting element 300 disposed on the magnetic layer 730.

Although the upper surface of the first electrode 710 and the upper surface of the magnetic layer 730 are shown as identical in the drawings, the upper surface of the first electrode 710 may be positioned higher than the upper surface of the magnetic layer 730. In this case, one side of the light emitting element 300 may be disposed in contact with or spaced apart from the inner surface of the first electrode 710. In addition, at least a lower surface of the blocking layer 740 disposed on the first electrode 710 may be positioned higher than the upper side of the light emitting element 300 disposed on the magnetic layer 730.

According to the fourth embodiment, since the blocking layer 740 is disposed on the first electrode 710, the misaligned magnetic layer 330 of the light emitting element 300 may prevent the magnetic layer 730 from being attached. Accordingly, it is easy to collect the misaligned light emitting elements 300, and the manufacturing cost can be drastically lowered according to the increase in the collection rate.

The Fifth Embodiment

Figure 14:
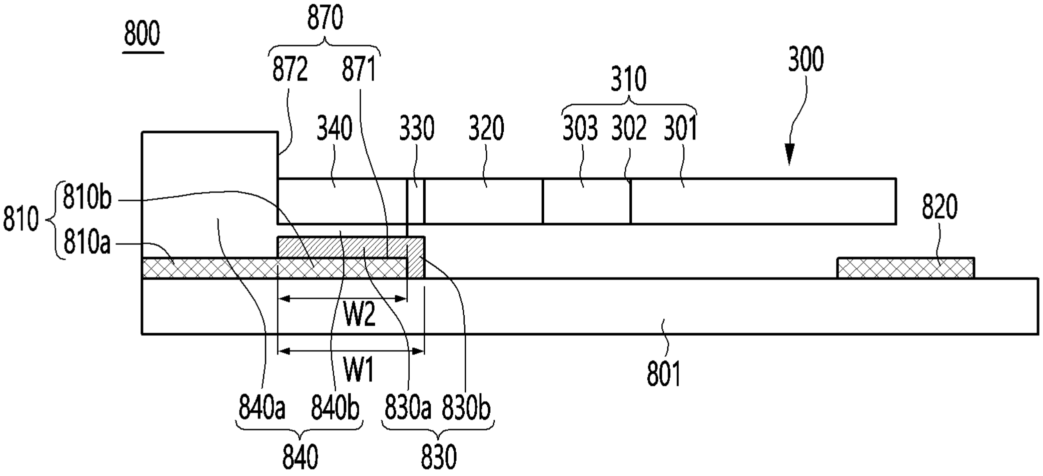
FIG. 14 is a cross-sectional view of a display device according to a fifth embodiment.

FIG. 14 is a cross-sectional view of a display device according to a fifth embodiment.

In the fifth embodiment, the arrangement of the first electrode 810 and the second electrode 820 may be the same as that of the first embodiment (FIG. 8).

Descriptions omitted in the following fifth embodiment can be easily understood from the first or second embodiment.

Referring to FIG. 14, a display device 800 according to a fifth embodiment may comprise a substrate 801, a first electrode 810, a second electrode 820, a magnetic layer 830, a blocking layer 840, and a plurality of light emitting elements 300.

The light emitting element 300 may be the light emitting element 300 shown in FIG. 7. Therefore, since the light emitting element 300 can be easily understood from the light emitting element 300 shown in FIG. 7, detailed descriptions will be omitted.

The substrate 801 may be the first substrate 40 shown in FIG. 6, but is not limited thereto. Therefore, since the substrate 801 can be easily understood from the first substrate 40 shown in FIG. 6, detailed descriptions will be omitted.

The substrate 801 may include a plurality of sub-pixels (PX1, PX2, and PX3 in FIG. 2). Since each of the plurality of sub-pixels PX1, PX2, and PX3 has been described in detail in the first embodiment, related descriptions will be omitted.

For example, the first electrode 810 may include a first electrode portion 810*a* and a second electrode portion 810*b*. The first electrode portion 810*a* and the second electrode portion 810*b* may be integrally formed of a metal, but are not limited thereto.

For example, the second electrode portion 810*b* may extend toward the second electrode 820. That is, the first electrode portion 810*a* may be positioned away from the second electrode 820, and the second electrode portion 810*b* may be positioned closer to the second electrode 720. For example, the second electrode portion 810*b* may be located closer to the second electrode 820 than the first electrode portion 810*a*.

For example, the first electrode portion 810*a* and the second electrode portion 810*b* may have the same thickness, but this is not limited thereto.

The magnetic layer 830 may surround a portion of the first electrode 810. For example, the magnetic layer 830 may surround the second electrode portion 810*b* of the first electrode 810.

The magnetic layer 830 may include a first magnetic portion 830*a* and a second magnetic portion 830*b*.

For example, the first magnetic portion 830*a* may be disposed on the upper surface of the second electrode portion 810*b* of the first electrode 810. The second magnetic portion 830*b* extends from the first magnetic portion 830*a* toward the second electrode 820 and may be disposed on the side surface of the second electrode portion 810*b* of the first electrode 810.

For example, the first magnetic portion 830*a* vertically overlaps the second electrode portion 810*b* of the first electrode 810, and the second magnetic portion 830*b* may overlap horizontally the second electrode portion 810*b* of the first electrode 810.

According to the fifth embodiment, since the magnetic layer 830 surrounds the second electrode portion 810*b* of the first electrode 810, the first electrode 810 may be prevented from being separated from the substrate 801.

According to the fifth embodiment, the magnetic layer 830 may be in contact with the side surface as well as the upper surface of the second electrode portion 810*b* of the first electrode 810 such that the contact area between the magnetic layer 83*o* and the second portions 810*b* of the first electrode 810 may be maximized. Accordingly, contact resistance between the magnetic layer 830 and the first electrode 810 is minimized such that voltage of the first electrode 810 can be easily applied to the light emitting element 300 through the magnetic layer 830.

The plurality of light emitting elements 300 may be aligned between the first electrode 810 and the second electrode 820 by using the dielectrophoretic force formed between the first electrode 810 and the second electrode 820 and/or the magnetic force formed by the magnetic layer 830. One side of each of the aligned plurality of light emitting elements 300 may be positioned on the magnetic layer 830. That is, the blocking layer 340 and the magnetic layer 330 of the light emitting element 300 may be positioned on the magnetic layer 830.

For example, the blocking layer 340 of the light emitting element 300 may be in contact with the upper surface of the first magnetic portion 830*a* of the magnetic layer 830, and the magnetic layer 330 of the light emitting element 300 may be in contact with the upper surface of the second magnetic portion 830*b* of the magnetic layer 830.

Accordingly, voltage applied to the first electrode 810 may be applied to the magnetic layer 330 of the light emitting element 300 via the second magnetic portion 830*b* of the magnetic layer 830.

The blocking layer 340 of the light emitting element 300 may vertically overlap the magnetic layer 830, and the magnetic layer 330 of the light emitting element 300 may vertically overlap the magnetic layer 830. The blocking layer 340 and the magnetic layer 330 of the light emitting element 300 may vertically overlap the second electrode portion 810*b* of the first electrode 810.

When the blocking layer 340 of the light emitting element 300 is made of metal, both the blocking layer 340 and the magnetic layer 330 of the light emitting element 300 may contact the magnetic layer 830. Accordingly, since voltage is applied from the second electrode portion 810*b* of the first electrode 810 to the blocking layer 340 and the magnetic layer 330 of the light emitting element 300, current is more smoothly passed through the light emitting element 300, and high output light can be obtained by driving at a low voltage.

For example, the upper surface of the first electrode portion 810*a* of the first electrode 810 may be positioned equal to or higher than the upper surface of the light emitting element 300 disposed on the magnetic layer 830.

Meanwhile, the blocking layer 840 may include a seating portion 870 having a step therein. The light emitting element 300 may be disposed on the bottom surface 871 of the seating portion 870. That is, the blocking layer 340 and the magnetic layer 330 of the light emitting element 300 may come into contact with the bottom surface 871 of the seating portion 870. One side surface of the magnetic layer 830 may be in contact with the inner surface 872 of the seating portion 870.

The blocking layer 840 may be disposed on the first electrode 810. Although the drawing shows that the blocking layer 840 is disposed on the entire upper surface of the first electrode 810, the blocking layer 840 may be disposed on a part of the upper surface of the first electrode 810.

The blocking layer 840 may be positioned higher than the upper surface of the magnetic layer 830. The blocking layer 840 may be made of an insulating material or a metal.

The blocking layer 840 may serve to prevent the magnetic layer 330 of the misaligned light emitting element 300 from being attached to the magnetic layer 830. To this end, the blocking layer 840 may be thicker than the magnetic layer 830. For example, the thickness of the blocking layer 840 may be 3 to 10 times greater than the thickness of the magnetic layer 830, but is not limited thereto. When the thickness of the blocking layer 840 is less than three times the thickness of the magnetic layer 830 and the light emitting element 300 is misaligned and disposed on the substrate 801, the thickness of the blocking layer 840 is small and the magnetic layer 330 of the light emitting element 300 may be attached to the magnetic layer 830 of the substrate 801. When the thickness of the blocking layer 840 exceeds 10 times the thickness of the magnetic layer 830, the thickness of the display device 800 may be increased because the thickness of the blocking layer 840 is thick.

A portion of the blocking layer 840 may surround the magnetic layer 830.

The blocking layer 840 may include a first blocking portion 840*a* and a second blocking portion 840*b*.

The first blocking portion 840*a* may be disposed on the first electrode portion 810*a* of the first electrode 810.

The second blocking portion 840*b* may extend from the first blocking portion 840*a* toward the second electrode 820 and be disposed on the first magnetic portion 830*a* of the magnetic layer 830. For example, the upper surface of the second blocking portion 840*b* may be positioned lower than the upper surface of the first blocking portion 840*a*.

For example, the first magnetic portion 830*a* of the magnetic layer 830 may vertically overlap the second electrode portion 810*b* of the first electrode 810. For example, the second blocking portion 840*b* of the blocking layer 840 may vertically overlap the first magnetic portion 830*a* of the magnetic layer 830 or the second electrode portion 810*b* of the first electrode 810.

For example, the first magnetic portion 830*a* of the magnetic layer 830 may be surrounded by the first blocking portion 840*a* and the second blocking portion 840*b* of the blocking layer 840 such that the magnetic layer 830 may not be separated from the electrode 810.

One side of each of the plurality of light emitting elements 300 may be disposed on the second blocking portion 840*b* of the blocking layer 840.

For example, the second blocking portion 840*b* of the blocking layer 840 may not be disposed on the second magnetic portion 830*b* of the magnetic layer 830. In this case, the blocking layer 340 of the light emitting element 300 may be in contact with the upper surface of the second magnetic portion 830*b* of the magnetic layer 830, and the magnetic layer 330 of the light emitting element 300 may not contact the second magnetic portion 830*b* of the magnetic layer 830.

For example, the width W1 of the magnetic layer 830 may be greater than the width W2 of the second blocking portion 840*b* of the blocking layer 840. For example, the width W2 of the second blocking portion 840*b* of the blocking layer 840 may be equal to or greater than the thickness of the blocking layer 340 of the light emitting element 300.

For example, when the light emitting element 300 is disposed on the magnetic layer 830, the blocking layer 340 of the light emitting element 300 may be in contact with the second blocking portion 840*b* of the blocking layer 840, and the magnetic layer 830 of the light emitting element 300 may not contact the second blocking portion 840*b* of the blocking layer 840. In this case, the blocking layer 340 of the light emitting element 300 may be spaced apart from the first magnetic portion 830*a* of the magnetic layer 830 with the second blocking portion 840*b* of the blocking layer 840 therebetween. Also, the magnetic layer 330 of the light emitting element 300 may be spaced apart from the second magnetic portion 830*b* of the magnetic layer 830.

For example, the magnetic layer 330 of the light emitting element 300 may be vertically spaced apart from the second magnetic portion 830*b* of the magnetic layer 830. The thickness of the second blocking portion 840*b* of the blocking layer 840 may be very thin. In this case, even if the magnetic layer 330 of the light emitting element 300 is spaced apart from the second magnetic portion 830*b* of the magnetic layer 830, magnetic layer 330 of the light emitting element 300 may be fixed to the magnetic layer 830 by the magnetic force of the magnetic layer 830. The second blocking portion 840*b* of the blocking layer 840 may be designed to have a thin thickness such that the magnetic force of the magnetic layer 830 sufficiently reaches the magnetic layer 330 of the light emitting element 300. For example, the thickness of the second blocking portion 840*b* of the blocking layer 840 may be smaller than the thickness of the magnetic layer 330 of the light emitting element 300, but is not limited thereto.

Although not shown, the second blocking portion 840*b* of the blocking layer 840 may be disposed on the second magnetic portion 830*b* as well as the first magnetic portion 830*a* of the magnetic layer 830. In this case, the blocking layer 840 may be formed of a material through which the magnetic force of the magnetic layer 830 is transmitted. Even if the second magnetic portion 830*b* of the magnetic layer 830 and the magnetic layer 330 of the light emitting element 300 are spaced apart from each other with the second blocking portion 840*b* of the blocking layer 840 interposed therebetween, the magnetic force of the magnetic layer 830 may pass through the second blocking portion 840*b* of the blocking layer 840 and reach the magnetic layer 330 of the light emitting element 300. Accordingly, the magnetic layer 330 of the light emitting element 300 disposed on the second blocking portion 840*b* of the blocking layer 840 may be fixed to the second magnetic portion 830*b* of the magnetic layer 830 disposed below the second blocking portion 840*b*.

According to the fifth embodiment, since the blocking layer 840 is disposed on the first electrode 810, the magnetic layer 330 of the misaligned light emitting element 300 may prevent the magnetic layer 830 from being attached. Accordingly, it is easy to collect the misaligned light emitting elements 300, and the manufacturing cost can be drastically lowered according to the increase in the collection rate.

The Sixth Embodiment

Figure 15:
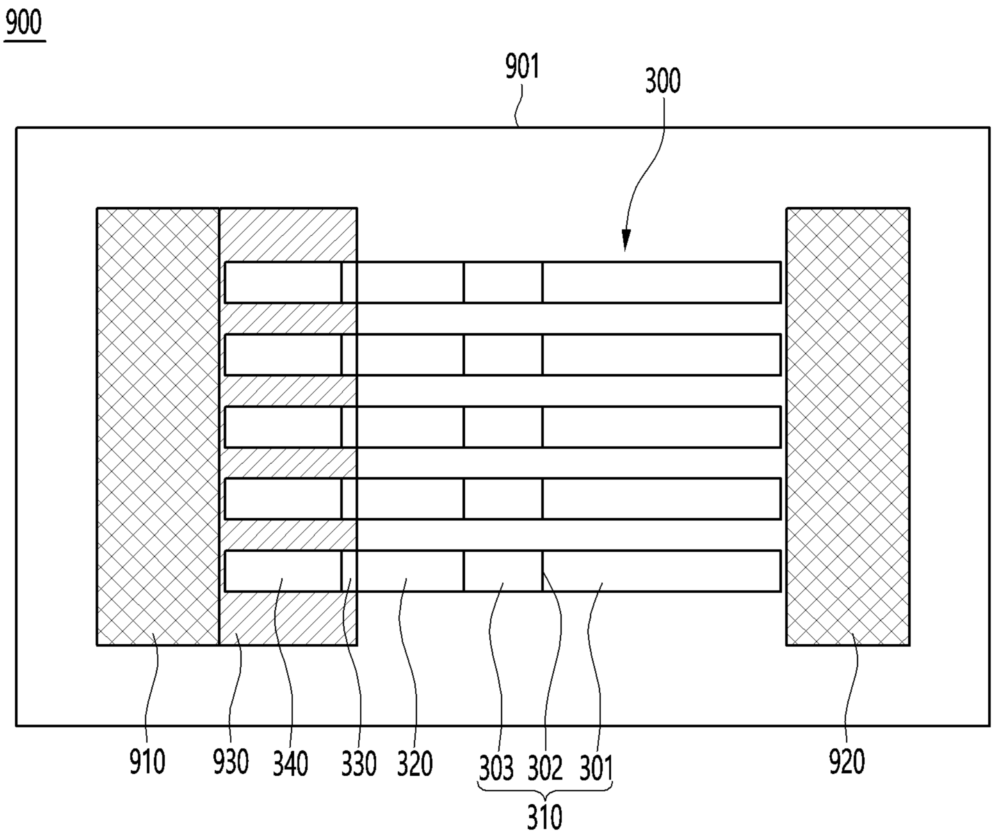
FIG. 15 is a cross-sectional view of a display device according to a sixth embodiment.

FIG. 15 is a cross-sectional view of a display device according to a sixth embodiment.

In the first embodiment (FIG. 8), the first electrode 410 may have a dot shape, and the second electrode 420 and the magnetic layer 430 may have a closed loop structure surrounding the first electrode 410.

Unlike this, as shown in FIG. 15, in the sixth embodiment, the first electrode 910 and the second electrode 920 may be disposed on the substrate 901. The first electrode 910 and the second electrode 920 may be linear lines disposed parallel to each other.

Accordingly, the magnetic layer 930 may also be disposed parallel to the first electrode 910 along the length direction of the first electrode 910. For example, the magnetic layer 930 may be disposed adjacent to the first electrode 910 between the first electrode 910 and the second electrode 920. For example, the magnetic layer 930 may contact the first electrode 910 between the first electrode 910 and the second electrode 920.

The first electrode 910 may be the first electrode 210 shown in FIG. 4 and the second electrode 920 may be the second electrode 220 shown in FIG. 4, but is not limited thereto.

A plurality of light emitting elements 300 may be disposed between the first electrode 910 and the second electrode 920 by using the dielectrophoretic force formed between the first electrode 910 and the second electrode 920 and/or the magnetic force formed by the magnetic layer 930.

In this case, one side of the light emitting element 300 may be disposed on the magnetic layer 930. For example, the blocking layer 340 and the magnetic layer 330 of the light emitting element 300 may be disposed on the upper surface of the magnetic layer 930. For example, the magnetic layer 330 of the light emitting element 300 may be attached to the upper surface of the magnetic layer 930 by the magnetic force of the magnetic layer 930.

The sixth embodiment can be equally applied to the second to fifth embodiments as in the first embodiment.

The above detailed description should not be construed as limiting in all respects and should be considered illustrative. The scope of the embodiments should be determined by reasonable interpretation of the appended claims, and all changes within the equivalent range of the embodiments are included in the scope of the embodiments.

INDUSTRIAL APPLICABILITY

The embodiment may be adopted in the display field for displaying images or information.

The invention claimed is:

1. A display device, comprising:

a substrate comprising a plurality of sub pixels;

a first electrode disposed at a center area of each of the plurality of sub pixels;

a second electrode disposed in the plurality of sub pixels, and disposed to be spaced apart from the first electrode and surrounding the first electrode;

a first magnetic layer between the first electrode and the second electrode; and a plurality of light emitting elements between the first electrode and the second electrode, wherein the first electrode has a first side surface configured to be in contact with and electrically connected to a side surface of the first magnetic layer, and a second side surface located higher than the first side surface and configured to be in contact with and electrically connected to a side surface of a light emitting element of the plurality of light emitting elements, wherein the light emitting element comprises at least one second magnetic layer configured to be in contact with the first magnetic layer, and wherein the plurality of light emitting elements are radially disposed between the second side surface of the first electrode and a side surface of the second electrode, and are configured to horizontally overlap with the second side surface of the first electrode and the side surface of the second electrode.

2. The display device of claim 1, wherein the at least one second magnetic layer of the light emitting element is disposed on the first magnetic layer.

3. The display device of claim 1, wherein the first magnetic layer is in contact with the first side surface of the first electrode between the first electrode and the second electrode.

4. The display device of claim 1, wherein the first electrode has an upper surface higher than an upper surface of the first magnetic layer.

5. The display device of claim 4, wherein the upper surface of the first electrode is located higher than an upper surface of the light emitting element disposed on the first magnetic layer.

6. The display device of claim 1, wherein the light emitting element comprises:

a first conductivity type semiconductor layer;

a second conductivity type semiconductor layer; and an active layer between the first conductivity type semiconductor layer and the second conductivity type semiconductor layer, wherein the at least one second magnetic layer is adjacent to at least one of the first conductivity type semiconductor layer and the second conductivity type semiconductor layer.

7. The display device of claim 6, further comprising:

a first blocking layer on an outer surface of the at least one second magnetic layer.

8. The display device of claim 7, wherein the first blocking layer is an insulating material or a metal.

9. The display device of claim 7, wherein a width of the first magnetic layer is at least greater than a sum of a thickness of the at least one second magnetic layer and a thickness of the first blocking layer.

10. The display device of claim 7, wherein the first electrode includes:

a first electrode portion; and a second electrode portion extending from the first electrode portion toward the second electrode.

11. The display device of claim 10, wherein the second electrode portion has an upper surface lower than an upper surface of the first electrode portion.

12. The display device of claim 10, wherein the first magnetic layer is disposed on the second electrode portion.

13. The display device of claim 10, wherein the first magnetic layer includes:

a first magnetic portion on an upper surface of the second electrode portion; and a second magnetic portion extending from the first magnetic portion toward the second electrode and disposed on a side surface of the second electrode portion, wherein the first blocking layer is in contact with an upper surface of the first magnetic portion, and wherein the at least one second magnetic layer is in contact with an upper surface of the second magnetic portion.

14. The display device of claim 13, further comprising:

a second blocking layer on the first electrode portion.

15. The display device of claim 14, wherein the second blocking layer is an insulating material or a metal.

16. The display device of claim 14, wherein an upper surface of the second blocking layer is positioned higher than the upper surface of the second electrode portion.

17. The display device of claim 16, wherein the upper surface of the second blocking layer is positioned higher than an upper side of the light emitting element disposed on the first magnetic layer.

18. The display device of claim 14, wherein the second blocking layer includes a first blocking portion on the first electrode portion; and a second blocking portion extending from the first blocking portion toward the second electrode, disposed on the first magnetic portion, and having an upper surface lower than an upper surface of the first blocking portion.

19. The display device of claim 18, wherein the first blocking layer is in contact with an upper surface of the second blocking portion, and wherein the at least one second magnetic layer is spaced apart from the upper surface of the second magnetic portion.

20. The display device of claim 1, wherein the first electrode has a dot shape, and wherein the second electrode has a closed loop structure surrounding the first electrode.

* * * * *